(12) United States Patent
Akamatsu

(10) Patent No.: US 10,607,686 B2
(45) Date of Patent: *Mar. 31, 2020

(54) APPARATUSES AND METHODS FOR CONTROLLING REFRESH OPERATIONS

(71) Applicant: Micron Technology, Inc., Boise, ID (US)

(72) Inventor: Hiroshi Akamatsu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/112,471

(22) Filed: Aug. 24, 2018

(65) Prior Publication Data

US 2019/0013059 A1 Jan. 10, 2019

Related U.S. Application Data

(63) Continuation of application No. 15/888,993, filed on Feb. 5, 2018, now Pat. No. 10,153,031, which is a
(Continued)

(30) Foreign Application Priority Data

May 21, 2014 (JP) .................................. 2014-105197

(51) Int. Cl.
*G11C 7/00* (2006.01)
*G11C 11/408* (2006.01)
(Continued)

(52) U.S. Cl.
CPC .............. *G11C 11/408* (2013.01); *G11C 5/04* (2013.01); *G11C 5/063* (2013.01); *G11C 29/18* (2013.01); *G11C 29/78* (2013.01); *G11C 8/12* (2013.01)

(58) Field of Classification Search
CPC ......... G11C 11/408; G11C 5/04; G11C 5/063; G11C 29/18; G11C 29/78; G11C 8/12
(Continued)

(56) References Cited

U.S. PATENT DOCUMENTS

| 5,933,377 A | 8/1999 | Hidaka |
| 5,943,283 A | 8/1999 | Wong et al. |

(Continued)

FOREIGN PATENT DOCUMENTS

| CN | 101038785 A | 9/2007 |
| CN | 101067972 A | 11/2007 |

(Continued)

OTHER PUBLICATIONS

U.S. Appl. No. 16/160,801, titled "Apparatuses and Methods for Selective Row Refreshes" filed Oct. 15, 2018, pp. all.
(Continued)

*Primary Examiner* — Viet Q Nguyen
(74) *Attorney, Agent, or Firm* — Dorsey & Whitney LLP

(57) ABSTRACT

An apparatus includes a first word line, a second word line and a control. The second word line is contiguous to the first word line. The control circuit includes a first defective address storing circuit and a fast detection circuit. The first defective address storing circuit stores first enable information along with first defective address. The first enable information indicates whether or not the second word line is functional. The first detection circuit provides a first signal when the first word line is accessed. The first signal indicates whether or not the second word line is functional. The control circuit activates the second word line when the first signal indicates that the second word line is functional and does not activate the second word line when the first signal indicates that the second word line is not functional.

33 Claims, 17 Drawing Sheets

Related U.S. Application Data continuation of application No. 14/713,942, filed on May 15, 2015, now Pat. No. 9,922,694.

(51) Int. Cl.
*G11C 5/04* (2006.01)
*G11C 5/06* (2006.01)
*G11C 29/18* (2006.01)
*G11C 29/00* (2006.01)
*G11C 8/12* (2006.01)

(58) Field of Classification Search
USPC ................................. 365/96, 222, 230.01
See application file for complete search history.

(56) References Cited

U.S. PATENT DOCUMENTS

| | | | |
|---|---|---|---|
| 5,970,507 A | 10/1999 | Kato et al. | |
| 6,011,734 A | 1/2000 | Pappert | |
| 6,061,290 A | 5/2000 | Shirley | |
| 6,212,118 B1 | 4/2001 | Fujita | |
| 6,310,806 B1 | 10/2001 | Higashi et al. | |
| 6,424,582 B1 | 7/2002 | Ooishi | |
| 6,434,064 B2 | 8/2002 | Nagai | |
| 6,452,868 B1 | 9/2002 | Fister | |
| 7,057,960 B1 | 6/2006 | Fiscus et al. | |
| 7,187,607 B2 | 3/2007 | Koshikawa et al. | |
| 7,203,115 B2 | 4/2007 | Eto et al. | |
| 7,444,577 B2 | 10/2008 | Best et al. | |
| 7,551,502 B2 | 6/2009 | Dono et al. | |
| 7,830,742 B2 | 11/2010 | Han | |
| 8,625,360 B2 | 1/2014 | Iwamoto et al. | |
| 8,681,578 B2 | 3/2014 | Narui | |
| 8,811,100 B2 | 8/2014 | Ku | |
| 8,862,973 B2 | 10/2014 | Zimmerman et al. | |
| 8,938,573 B2 | 1/2015 | Greenfield et al. | |
| 9,032,141 B2 | 5/2015 | Bains et al. | |
| 9,047,978 B2 | 6/2015 | Bell et al. | |
| 9,117,544 B2* | 8/2015 | Bains ............... G11C 11/40615 | |
| 9,123,447 B2* | 9/2015 | Lee ................... G11C 29/025 | |
| 9,153,294 B2 | 10/2015 | Kang | |
| 9,190,139 B2 | 11/2015 | Jung et al. | |
| 9,286,964 B2* | 3/2016 | Halbert ............ G11C 11/40603 | |
| 9,311,985 B2* | 4/2016 | Lee ................ G11C 11/40615 | |
| 9,324,398 B2 | 4/2016 | Jones et al. | |
| 9,384,821 B2* | 7/2016 | Bains ................. G06F 13/1636 | |
| 9,412,432 B2* | 8/2016 | Narui ................. G11C 11/40611 | |
| 9,424,907 B2* | 8/2016 | Fujishiro ............ G11C 11/406 | |
| 9,484,079 B2* | 11/2016 | Lee ................ G11C 11/40626 | |
| 9,514,850 B2 | 12/2016 | Kim | |
| 9,570,143 B2* | 2/2017 | Lim ................. G11C 11/406 | |
| 9,646,672 B1* | 5/2017 | Kim ................. G11C 11/406 | |
| 9,672,889 B2* | 6/2017 | Lee ................. G11C 11/406 | |
| 9,691,466 B1* | 6/2017 | Kim ................. G11C 11/406 | |
| 9,741,409 B2 | 8/2017 | Jones et al. | |
| 9,741,447 B2* | 8/2017 | Akamatsu ............. G11C 17/18 | |
| 9,747,971 B2* | 8/2017 | Bains ................. G11C 11/40618 | |
| 9,786,351 B2* | 10/2017 | Lee ................ G11C 11/40615 | |
| 9,799,391 B1 | 10/2017 | Wei | |
| 9,805,782 B1* | 10/2017 | Liou ................... G11C 11/403 | |
| 9,805,783 B2 | 10/2017 | Ito et al. | |
| 9,818,469 B1* | 11/2017 | Kim .................... G06F 3/0619 | |
| 9,865,326 B2 | 1/2018 | Bains et al. | |
| 9,922,694 B2* | 3/2018 | Akamatsu ............ G11C 29/78 | |
| 9,934,143 B2 | 4/2018 | Bains et al. | |
| 9,953,696 B2* | 4/2018 | Kim ................. G11C 11/40622 | |
| 10,032,501 B2 | 7/2018 | Ito et al. | |
| 10,083,737 B2* | 9/2018 | Bains ................. G06F 13/1636 | |
| 10,134,461 B2 | 11/2018 | Bell et al. | |
| 10,147,472 B2 | 12/2018 | Jones et al. | |
| 10,153,031 B2* | 12/2018 | Akamatsu ............ G11C 29/78 | |
| 10,210,925 B2* | 2/2019 | Bains ................. G11C 11/40618 | |
| 10,297,305 B1* | 5/2019 | Moon ................. G11C 29/783 | |
| 10,339,994 B2 | 7/2019 | Ito et al. | |
| 2001/0008498 A1 | 7/2001 | Ooishi | |
| 2002/0131301 A1 | 12/2002 | Takahashi et al. | |
| 2003/0067825 A1 | 4/2003 | Shimano et al. | |
| 2003/0123301 A1 | 7/2003 | Jang et al. | |
| 2003/0193829 A1 | 10/2003 | Morgan et al. | |
| 2004/0008544 A1 | 1/2004 | Shinozaki et al. | |
| 2004/0022093 A1 | 2/2004 | Lee | |
| 2004/0114446 A1 | 6/2004 | Takahashi et al. | |
| 2004/0130959 A1 | 7/2004 | Kawaguchi | |
| 2004/0184323 A1 | 9/2004 | Mori et al. | |
| 2004/0218431 A1 | 11/2004 | Chung et al. | |
| 2006/0083099 A1 | 4/2006 | Bae et al. | |
| 2006/0087903 A1 | 4/2006 | Riho et al. | |
| 2006/0176744 A1 | 8/2006 | Stave | |
| 2006/0262616 A1 | 11/2006 | Chen | |
| 2007/0008799 A1 | 1/2007 | Dono et al. | |
| 2007/0030746 A1 | 2/2007 | Best et al. | |
| 2007/0297252 A1 | 12/2007 | Singh | |
| 2008/0028260 A1 | 1/2008 | Oyagi et al. | |
| 2008/0031068 A1 | 2/2008 | Yoo et al. | |
| 2008/0126893 A1 | 5/2008 | Harrand et al. | |
| 2008/0130394 A1 | 6/2008 | Dono et al. | |
| 2008/0181048 A1 | 7/2008 | Han | |
| 2008/0266990 A1 | 10/2008 | Loeffler | |
| 2008/0316845 A1 | 12/2008 | Wang et al. | |
| 2009/0185440 A1 | 7/2009 | Lee | |
| 2009/0201752 A1 | 8/2009 | Riho et al. | |
| 2010/0074042 A1 | 3/2010 | Fukuda et al. | |
| 2010/0110809 A1 | 5/2010 | Kobayashi et al. | |
| 2010/0110810 A1 | 5/2010 | Kobayashi | |
| 2010/0131812 A1 | 5/2010 | Mohammad | |
| 2010/0157693 A1 | 6/2010 | Iwai et al. | |
| 2010/0329069 A1 | 12/2010 | Ito et al. | |
| 2011/0026290 A1 | 2/2011 | Noda et al. | |
| 2011/0069572 A1 | 3/2011 | Lee et al. | |
| 2011/0216614 A1 | 9/2011 | Hosoe | |
| 2011/0310648 A1 | 12/2011 | Iwamoto et al. | |
| 2012/0014199 A1 | 1/2012 | Narui | |
| 2012/0151131 A1 | 6/2012 | Kilmer et al. | |
| 2012/0213021 A1 | 8/2012 | Riho et al. | |
| 2013/0003467 A1 | 1/2013 | Klein | |
| 2013/0003477 A1 | 1/2013 | Park et al. | |
| 2014/0006704 A1 | 1/2014 | Greenfield et al. | |
| 2014/0050004 A1 | 2/2014 | Mochida | |
| 2014/0078842 A1 | 3/2014 | Oh et al. | |
| 2014/0089576 A1 | 3/2014 | Bains et al. | |
| 2014/0095786 A1 | 4/2014 | Moon et al. | |
| 2014/0177370 A1 | 6/2014 | Halbert et al. | |
| 2014/0189228 A1 | 7/2014 | Greenfield et al. | |
| 2014/0219043 A1 | 8/2014 | Jones et al. | |
| 2014/0237307 A1 | 8/2014 | Kobla et al. | |
| 2014/0241099 A1 | 8/2014 | Seo et al. | |
| 2014/0254298 A1 | 9/2014 | Dally | |
| 2014/0281206 A1 | 9/2014 | Crawford et al. | |
| 2014/0281207 A1 | 9/2014 | Mandava et al. | |
| 2015/0049567 A1 | 2/2015 | Chi | |
| 2015/0055420 A1 | 2/2015 | Bell et al. | |
| 2015/0089326 A1 | 3/2015 | Joo et al. | |
| 2015/0170728 A1 | 6/2015 | Jung et al. | |
| 2015/0243339 A1 | 8/2015 | Bell et al. | |
| 2015/0255140 A1 | 9/2015 | Song | |
| 2015/0279442 A1 | 10/2015 | Hwang | |
| 2015/0294711 A1 | 10/2015 | Gaither et al. | |
| 2015/0340077 A1 | 11/2015 | Akamatsu | |
| 2016/0019940 A1 | 1/2016 | Jang et al. | |
| 2016/0027531 A1 | 1/2016 | Jones et al. | |
| 2016/0027532 A1 | 1/2016 | Kim | |
| 2016/0042782 A1 | 2/2016 | Narui et al. | |
| 2016/0078911 A1 | 3/2016 | Fujiwara et al. | |
| 2016/0093402 A1 | 3/2016 | Kitagawa et al. | |
| 2016/0196863 A1 | 7/2016 | Shin et al. | |
| 2017/0076779 A1 | 3/2017 | Bains et al. | |
| 2017/0092350 A1 | 3/2017 | Halbert et al. | |
| 2017/0213586 A1 | 7/2017 | Kang et al. | |
| 2017/0287547 A1 | 10/2017 | Ito et al. | |
| 2017/0323675 A1 | 11/2017 | Jones et al. | |
| 2018/0025770 A1 | 1/2018 | Ito et al. | |
| 2018/0158504 A1 | 6/2018 | Akamatsu | |
| 2018/0182445 A1* | 6/2018 | Lee ........................ G11C 8/04 | |
| 2018/0294028 A1* | 10/2018 | Lee .................. G11C 11/40611 | |

(56) References Cited

U.S. PATENT DOCUMENTS

| | | |
|---|---|---|
| 2018/0308539 A1 | 10/2018 | Ito et al. |
| 2019/0051344 A1 | 2/2019 | Bell et al. |
| 2019/0103147 A1 | 4/2019 | Jones et al. |
| 2019/0130961 A1 | 5/2019 | Bell et al. |
| 2019/0228815 A1 | 7/2019 | Morohashi et al. |
| 2019/0267077 A1 | 8/2019 | Ito et al. |

FOREIGN PATENT DOCUMENTS

| | | | |
|---|---|---|---|
| JP | 2005-216429 | A | 8/2005 |
| JP | 2011-258259 | | 12/2011 |
| JP | 2011-258259 | A | 12/2011 |
| JP | 2013-004158 | A | 1/2013 |
| WO | 2014120477 | | 8/2014 |
| WO | 2015030991 | A1 | 3/2015 |
| WO | 2017171927 | A1 | 10/2017 |

OTHER PUBLICATIONS

U.S. Appl. No. 16/231,327 titled "Apparatuses and Methods for Selective Row Refreshes", filed Dec. 21, 2018.

U.S. Appl. No. 16/190,627 titled "Apparatuses and Methods for Targeted Refreshing of Memory" filed Nov. 14, 2018, pp. all.

U.S. Appl. No. 16/546,152 titled "Apparatuses and Methods for Analog Row Access Tracking" filed Aug. 20, 2019.

U.S. Appl. No. 16/548,027 titled "Apparatuses, Systems, and Methods for Analog Row Access Rate Determination" filed Aug. 22, 2019.

U.S. Appl. No. 16/549,942 titled "Apparatuses and Methods for Lossy Row Access Counting" filed Aug. 23, 2019.

U.S. Appl. No. 16/425,525 titled "Apparatuses and Methods for Tracking All Row Accesses" filed May 29, 2019.

U.S. Appl. No. 16/427,105 titled "Apparatuses and Methods for Priority Targeted Refresh Operations" filed May 30, 2019.

U.S. Appl. No. 16/427,140 titled "Apparatuses and Methods for Tracking Row Access Counts Between Multiple Register Stacks" filed May 30, 2019.

U.S. Appl. No. 16/437,811 titled "Apparatuses, Systems, and Methods for Determining Extremum Numerical Values" filed Jun. 11, 2019.

U.S. Appl. No. 16/012,679, titled "Apparatuses and Methods for Multiple Row Hammer Refresh Address Sequences", filed Jun. 19, 2018.

U.S. Appl. No. 16/268,818, titled "Apparatuses and Methods for Managing Row Access Counts", filed Feb. 6, 2019.

U.S. Appl. No. 16/358,587, titled "Semiconductor Device Having CAM That Stores Address Signals", dated Mar. 19, 2019.

U.S. Appl. No. 16/411,573 titled "Apparatuses, Systems, and Methods for a Content Addressable Memory Cell" filed May 14, 2019.

U.S. Appl. No. 16/427,330 titled "Apparatuses and Methods for Storing Victim Row Data" filed May 30, 2019.

U.S. Appl. No. 16/428,625 titled "Apparatuses and Methods for Tracking Victim Rows" filed May 31, 2019.

U.S. Appl. No. 16/459,520 titled "Apparatuses and Methods for Monitoring Word Line Accesses", filed Jul. 1, 2019, pp. all.

Kim, et al., "Flipping Bits in MemoryWithout Accessing Them: An Experimental Study of DRAM Disturbance Errors", IEEE, Jun. 2014, 12 pgs.

* cited by examiner

US 10,607,686 B2

APPARATUSES AND METHODS FOR CONTROLLING REFRESH OPERATIONS

PRIORITY

This application is a continuation of U.S. patent application Ser. No. 15/888,993, filed Feb. 5, 2018, and issued as U.S. Pat No. 10,153,031 on Dec. 11, 2018, which is a continuation of U.S. patent application Ser. No. 14/713,942, filed May 15, 2015, and issued as U.S. Pat No. 9,922,694 on Mar. 20. 2018, which claims the benefit of priority from Japanese Patent Application No. 2014-105197 filed on May 21, 2014. The aforementioned applications and patents are incorporated herein by reference, in their entirety, for any purpose.

BACKGROUND

Since a DRAM (Dynamic Random Access Memory), which is a typical semiconductor memory device, stores information by the electric charge accumulated in a cell capacitor, the information is lost unless a refresh operation is periodically carried out. Therefore, Japanese Patent Application Laid-Open No. 2011-258259 discloses that a control device, winch controls the DRAM, periodically issues a refresh command, which orders the refresh operation, to the DRAM. The refresh command is issued from the control device at a frequency that all word lines are certainly refreshed once in the period of one refresh cycle (for example, 64 msec).

However, depending on the history of access to memory cells, the information retention time of predetermined memory cells are reduced in some cases. Then, when the information retention time of the predetermined memory cells is reduced to less than the one refresh cycle, there has been a risk that part of the information may be lost even if the refresh command is issued at the frequency that all the word lines are refreshed once in the period of one refresh cycle.

In order to solve such a problem, recently, a technique which restores the electric charge with respect to the information-retention-time-reduced memory cells by utilizing the history of access to the memory cells has been studied. This technique is called target-row refresh.

Herein, in a case in which a defective word line is replaced by a redundant word line, erroneous operations may occur unless the target-row refresh operation is carried out in consideration of that. This is for a reason that actually-used (functional) redundant word lines and unused (non-functional) redundant word lines are mixed in the redundant word lines. More specifically, when the unused redundant word line is selected in a target-row refresh operation, for example, if micro short-circuit is present at the unused redundant word line or the memory cells connected thereto, there has been a risk that other data may be broken.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well known circuits, control signals, timing protocols, and software operations have not been shown in detail in order to avoid unnecessarily obscuring the invention.

Figure 1:
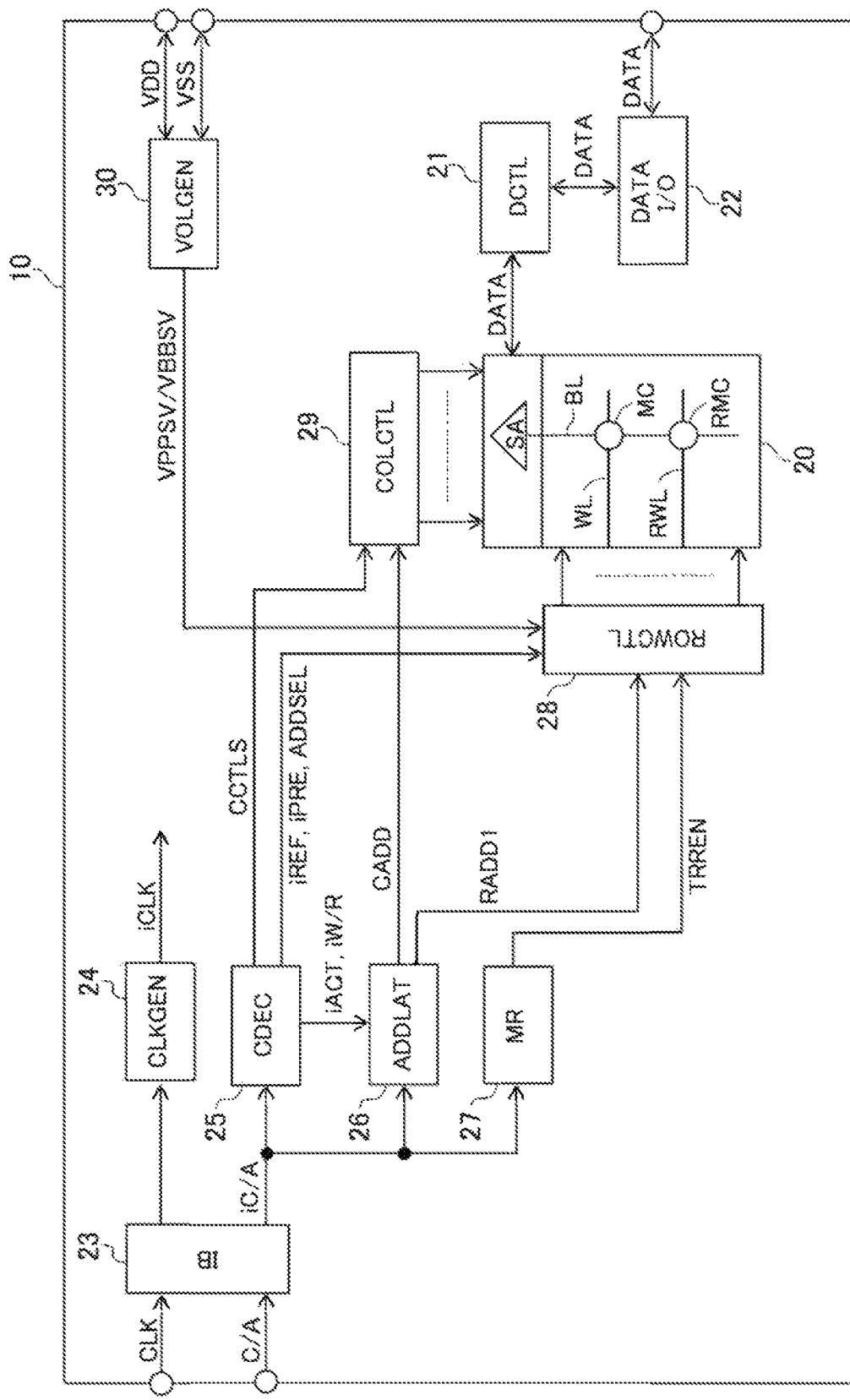
FIG. 1 is a block diagram showing a configuration of a semiconductor device according to an embodiment of the present invention.

FIG. 1 is a block diagram showing a configuration of a semiconductor device 10 according to the embodiment of the present invention.

The semiconductor device 10 according to the present embodiment is, for example, a DDR4 (Double Data Rate 4) type DRAM integrated on a single semiconductor chip and carries out read operations and write operations with respect to a memory cell array 20 based on external clock signals CLK and command/address signals C/A, which are input from an external controller. Data signals DATA which are read from the memory cell array 20 in the read operations are output to outside via a data control circuit 21 and a data input/output circuit 22. Data signals DATA which are input from outside in the write operations are written to the memory cell array 20 via the data input/output circuit 22 and the data control circuit 21.

As shown in FIG. 1, the external clock signals CLK and the external command/address signals C/A are input to an input receiver circuit 23. The external clock signals CLK input to the input receiver circuit 23 are supplied to a clock generation circuit 24, thereby generating internal clock signals iCLK. The internal clock signals iCLK are used as timing signals which define operation timing of the semiconductor device 10 according to the present embodiment.

The external command/address signals C/A input to the input receiver circuit 23 are supplied to a command decoder 25, an address latch circuit 26, and a mode register 27 as internal command/address signals iC/A. The command decoder 25 decodes command signals, which are contained in the internal command/address signals iC/A, thereby generating various control signals. Examples of the control signals generated by the command decoder 25 include active signals iACT, read/write signals iW/R, refresh signals iREF, precharge signals iPRE, address selection signals ADDSEL, and column control signals CCTL.

The active signal iACT is activated when the internal command-address signal iC/A is indicating an active command. When the active signal iACT is activated, a row address contained in the internal command/address signal iC/A is latched by the address latch circuit 26. The row address RADD1 latched by the address latch circuit 26 is supplied to a row control circuit 28. Based on the row address RADD1, the row control circuit 28 selectively activates any of a plurality of normal word lines WL and a plurality of redundant word lines RWS contained in the memory cell array 20. FIG. 1 shows a single normal word line WL and a single redundant word line RWL in the memory cell array 20. However, in practice, many normal word lines WL and many redundant word lines RWL are provided.

The read/write signal iW/R is activated when the internal command/address signal iC/A is indicating a read command or a write command. When the internal command/address signal iC/A is indicating the read command or the write command, the column control signal CCTL is also activated. When the read/write signal iW/R is activated, a column address contained in the internal command address signal iC/A is latched by the address latch circuit 26. The column address CADD latched by the address/latch circuit 26 is supplied to a column control circuit 29. When the column control signal CCTL is activated, the column control circuit 29 selectively connects any of a plurality of bit lines BL, which are contained in the memory cell array 20, to a corresponding sense amplifier SA based on the column address CADD. FIG. 1 shows a single bit line BL in the memory cell array 20. However, in practice, many bit lines BL are provided. The bit lines BL are connected to sense amplifiers SA, and read or write of the data signals DATA is carried out via the sense amplifiers SA.

More specifically, in a read operation, the data signal DATA is read from a normal memory cell MC disposed at the intersection point of the selected normal word line WL and the selected bit line BL or a redundant memory cell RMC disposed at the intersection point of the selected redundant word line RWL and the selected bit line BL, and the data signal DATA is output to outside via the data control circuit 21 and the data input/output circuit 22.

On the other hand, in a write operation, the data signal DATA input from outside is supplied to the memory cell array 20 via the data input/output circuit 22 and the data control circuit 21, and the data signal DATA is written to a normal memory cell MC disposed at the intersection point of the selected normal word line WL and the selected bit line BL or a redundant memory cell RMC disposed at the intersection point of the selected redundant word line RWL and the selected bit line BL.

The refresh signal iREF is activated when the internal command/address signal iC/A is indicating a refresh command. The refresh signal iREF is supplied to the row control circuit 28, thereby executing a refresh operation of normal memory cells MC or redundant memory cells RMC.

The precharge signal iPRE is actuated when the internal command/address signal iC/A is indicating a precharge command. The precharge signal iPRE is supplied to the row control circuit 28 therein deactivating the normal word line WL or the redundant word line RQL which have been activated.

The address selection signal ADDSEL is activated when the internal command address signal iC/A is indicating the active command or the refresh command. The address selection signal ADDSEL is supplied to the row control circuit 28, thereby executing selection of the normal word line WL or the redundant word line RWL serving as an access target.

Although details will be described later, the row control circuit 28 includes many antifuse elements. The antifuse element is an element which is insulated in an initial state and, when subjected to dielectric breakdown by a connect operation, makes a transition to a conductive state. When the transition to the conductive state is once made by the connect operation, the antifuse element cannot be returned again to the insulated state. Therefore, the antifuse element can be used as a nonvolatile and irreversible storage element. The connect operation with respect to the antifuse element uses a high potential VPPSV and a negative potential VBBSV. The high potential VPPSV and the negative potential VBBSV is generated by a power-source circuit 30 based on a power-source potential VDD and a ground potential VSS.

In the mode register 27, a parameter indicating an operation mode of the semiconductor device 10 according to the present embodiment is set. For example, if the internal command/address signal iC/A is indicating a target-row refresh command, a parameter indicating a target-row refresh mode is registered in the mode register 27, and a target-row refresh enable signal TRREN is activated. The target-row refresh enable signal TRREN is supplied to the row control circuit 28.

Figure 2:
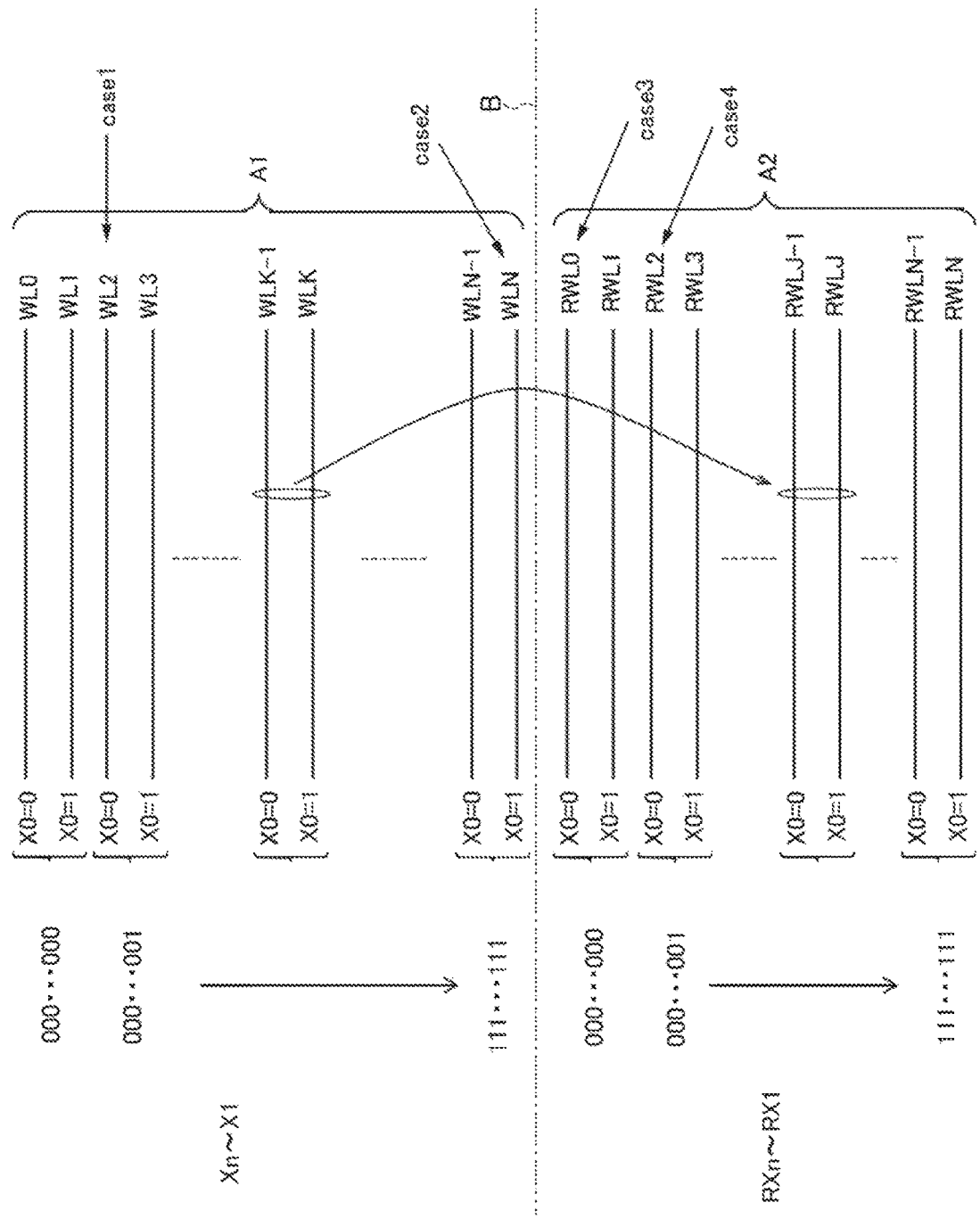
FIG. 2 is a drawing showing address allocation of normal word lines and redundant word lines according to an embodiment of the present invention.

FIG. 2 is a drawing for explaining address allocation of the normal word lines WL and the redundant word lines RWL.

As shown in FIG. 2, n+1-bit row addresses of Xn to X0 are assigned to the normal word lines WL, respectively, and the single normal word line WL is specified by each row address. Similarly, n+1-bit replacement addresses of RXn to RX0 are assigned to the redundant word lines RWL, respectively, and the single redundant word line RWL is specified by each replacement address. The number of the bits of the row address and the number of the bits of the replacement address are not necessarily the same. For example, the number of the bits of the replacement address may be smaller than the number of the bits of the row address.

The normal word lines WL are arranged in the order of the row addresses from the normal word line WL0 of the row address having all of the values of bits Xn to X0 being "0" to the normal word line WLN of the row address having all of the values of bits Xn to X0 being "1". Similarly, the redundant word lines RWL are arranged in the order of the replacement addresses from the redundant word line RWL0 of the replacement address having all of the values of bits RXn to RX0 being "0" to the redundant word line RWLN of the replacement address having all of the values of bits RXn to RX0 being "1". However, the normal word lines WL can be provided more than the redundant word lines RWL.

The normal word lines WL0 to WLN and the redundant word lines RWL0 to RWLN are continuously located. Therefore, one direction (upward direction shown in FIG. 2) viewed from a boundary B between the last normal word line WLN and the first redundant word line RWL0 serves as a normal-word-line area A1 in which the normal word lines WL0 to WLN are located, and the opposite direction (downward direction shown in FIG. 2) viewed from the boundary B serves as a redundant-word-line area A2 in which the redundant word lines RWL0 to RWLN are disposed.

As shown in FIG. 2, the two normal word lines WL at which only the least significant bit X0 is different among the bits Xn to X0 of the row addresses are disposed to be mutually adjacent. Similarly, the two redundant word lines RWL at which only the least significant bit X0 is different among the bits RXn to RX0 of the replacement addresses are also disposed to be mutually adjacent. If a defect is present in any of the normal word lines WL, a set having not only the normal word line WL that has the defect but also the different normal word line WL paired therewith is replaced by the redundant word lines RWL. For example, if a defect is present in the normal word line WLK, the paired normal word lines WLK−1 and WLK are collectively replaced by, for example, the redundant word lines RWLJ−1 and RWLJ. This is for reducing the number of the antifuse elements required.

Herein, if access is repeated with respect to a certain normal word line WL or redundant word line RWL, the information retention time of the normal memory cells MC or the redundant memory cells RMC connected to the normal word line WL or the redundant word line RWL adjacent therein are reduced. With respect to the normal memory cells MC or the redundant memory cell RMC having the reduced information retention time, the information retention time have to be recovered by carrying out a target-row refresh operation.

For example, access with respect to the normal word line WL2 shown in FIG. 2 is repeated, the information retention time of the normal memory cells MC connected to the normal word lines WL1 and WL3 adjacent thereto are reduced. This case can be solved by executing a target-row refresh operation with respect to the normal word lines WL1 and WL3. In this case (case 1), all of the word lines serving as the targets of the target-row refresh operation belong to the normal-word-line area A1.

If access is repeated with respect to the normal word line WLN shown in FIG. 2, the information retention time of the normal memory cells MC connected to the normal word line WLN−1 adjacent thereto and the redundant memory cells RMC connected to the redundant word line RWL0 are reduced. This case can be solved by executing the target-row refresh operation with respect to the normal word line WLN−1 and the redundant word line RWL0. In this case (case 2), one of the word lines serving as the targets of the target-row refresh operation belongs to the normal-word-line area A1, and the other one belongs to the redundant-word-line area A2.

Furthermore, if access with respect to the redundant word line RWL0 shown in FIG. 2 is repeated, the information retention time of the normal memory cells MC connected to the normal word line WL N connected thereto and the redundant memory cells RMC connected to the redundant word line RWL1 are reduced. This case can be solved by executing the target-row refresh operation with respect to the normal word line WLN and the redundant word line RWL1. Also in this case (case 3), one of the word lines serving as the targets of the target-row refresh operation belongs to the normal-word-line area A1, and the other one belongs to the redundant-word-line area A2.

If access with respect to the redundant word line RWL2 shown in FIG. 2 is repeated, the information retention time of the redundant memory cells RMC connected to the redundant word lines RWL1 and RWL3 adjacent thereto are reduced. This case can be solved by executing the target-row refresh operation with respect to the redundant word lines RWL1 and RWL3. In this case (case 4), all of the word lines serving as the targets of the target-row refresh operation belong to the redundant-word-line area A2.

If the normal-word-line area A1 and the redundant-word-line area A2 are continuously provided to be mutually adjacent in this manner, the target-row refresh operations have to be executed in consideration of the above described four cases. Although this point will be described later in detail, in order to correctly execute the target-row refresh operations in any of the four cases, the present embodiment includes the circuits which are necessary for correctly carrying out the target-row refresh operations in a case of occurrence of any of the case 1 to the case 4.

First, regarding the case 1 to the case 4, the circuit (address control circuit, address conversion circuit 46, 44) are provided for generating the addresses of the normal word lines WL or the redundant word lines RWL serving as the targets of target-row refresh are provided. Moreover, regarding the case 2, the circuit (boundary detection circuit 36) is provided for detecting that the normal word line WLN which is the closest to the redundant-word-line area A2 in the normal-word-line area A1 serves as a cause of the target-row-refresh operation. Similarly, regarding the case 3, the circuit (boundary detection circuit 40) is provided for detecting that the redundant word line RWL0 which is the closest to the normal-word-line area A1 serves as a cause of the target-row refresh operation. Furthermore, regarding the case 2 and the case 4, the circuit (usage detection circuit 37) is provided for detecting whether the redundant word line(s) RWL to be subjected to execution of the target-row refresh operation is actually used (functional) of not (non-functional).

Figure 3:
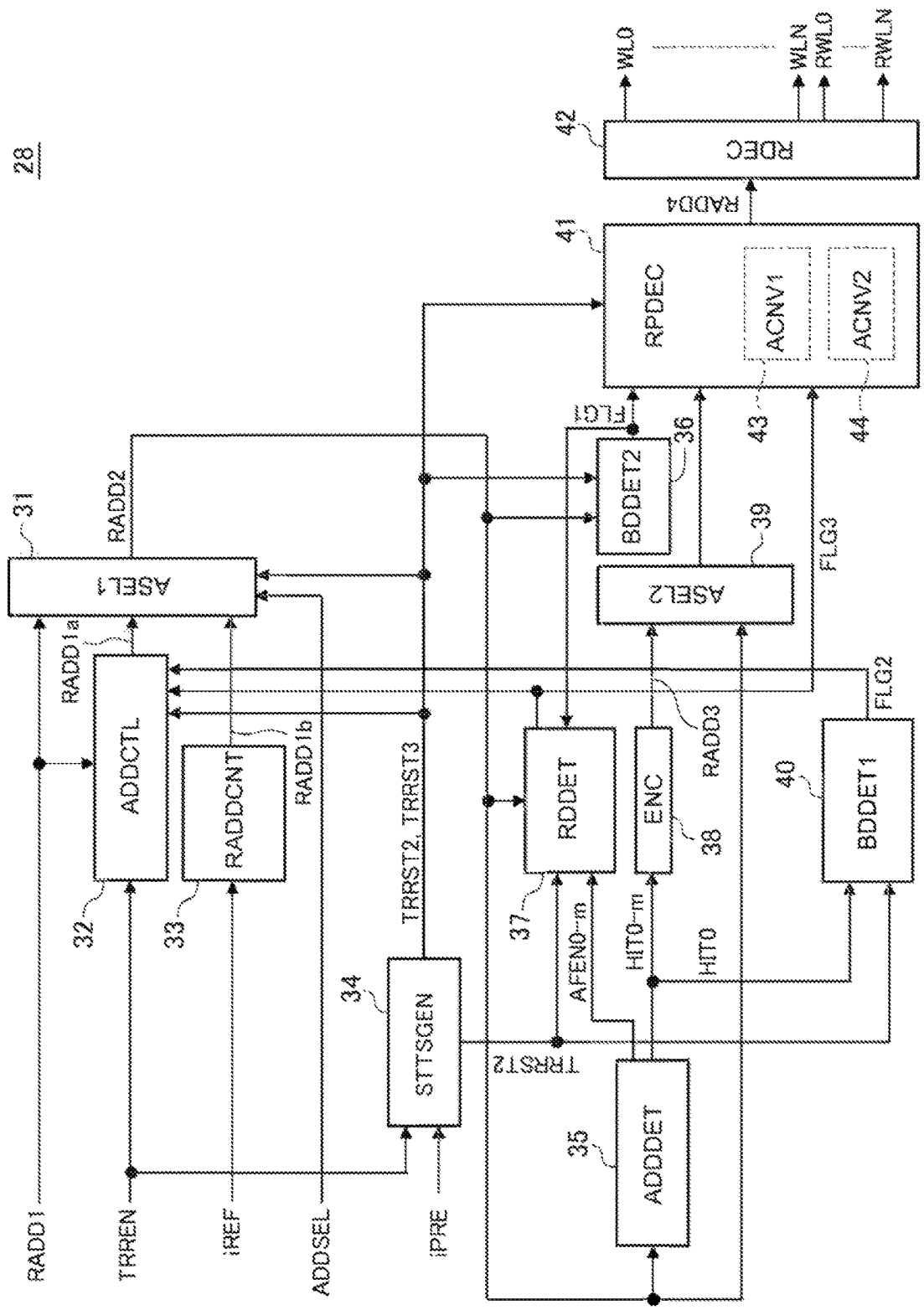
FIG. 3 is a block diagram showing a configuration of a row control circuit according to an embodiment of the present invention.

FIG. 3 is a block diagram showing a configuration of the row control circuit 28.

As shown in FIG. 3, the row control circuit 28 includes a selector 31, which generates a row address RADD2. The selector 31 receives the row address RADD1 supplied from the address latch circuit 26, a row address RADD1a supplied from an address control circuit 32, and a row address RADD1b supplied from a refresh address counter 33 and outputs any of the row addresses RADD1, RADD1a, and RADD1b as the RADD2.

The selection by the selector 31 is carried out based on the address selection signal ADDSEL and suite signals TRRST2 and TRRST3. Specifically if the address selection signal ADDSEL is indicating an issuance of an active command and both of the state signals TRRST2 and TRRST3 are at a low level (non-active level), the selector 31 selects the row address RADD1 and outputs this as the row address RADD2. If the address selection signal ADDSEL is indicating an issuance of an active command and at least one of the state signals TRRST2 and TRRST3 is at a high level (active level), the selector 31 selects the row address RADD1a and outputs this as the row address RADD2.

Furthermore, if the address selection signal ADDSEL is indicating an issuance of a refresh command, the selector selects the row address RADD1b regardless of the state signals TRRST2 and TRRST3 and outputs this as the row address RADD2.

The state signals TRRST2 and TRRST3 are generated by a state-signal generation circuit 34.

Figure 4:
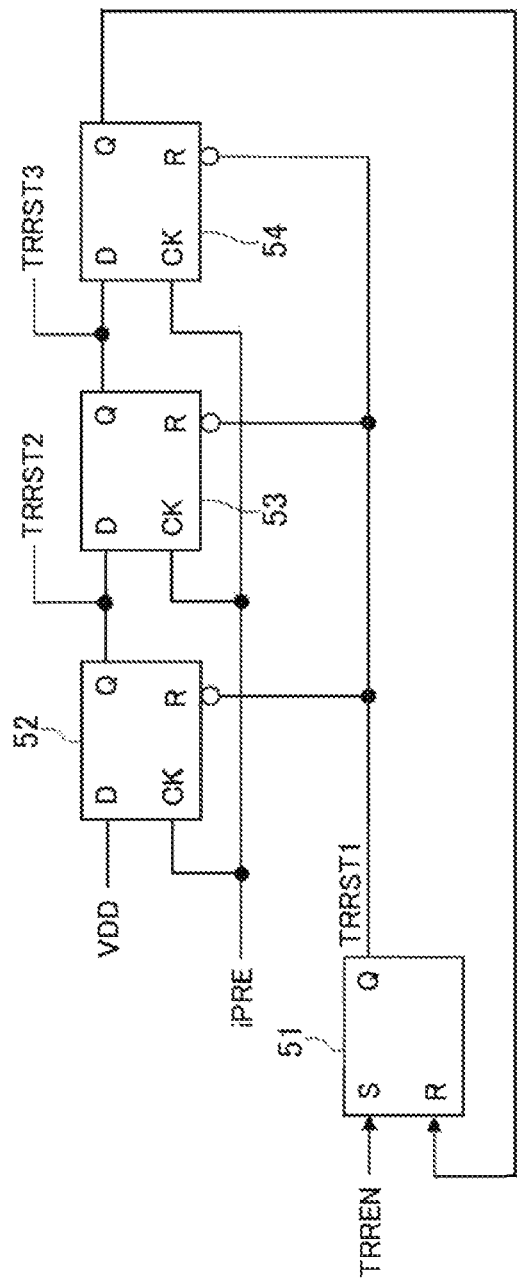
FIG. 4 is a circuit diagram of a state-signal generation circuit according to an embodiment of the present invention.

FIG. 4 is a circuit diagram of the state-signal generation circuit 34.

As shown in FIG. 4, the state-signal generation circuit 34 includes a SR-type flip-flop circuit 51 and D-latch-type flip-flop circuits 52 to 54. The flip-flop circuit 51 is set by the target-row refresh enable signal TRREN and is reset by the output signal of the flip-flop circuit 54. The flip-flop circuit 51 provides a state signal TRRST1 to reset nodes of the flip-flop circuits 52 to 54. The reset nodes of the flip-flop circuits 52 to 54 employ negative logic. Therefore, if the target-row refresh enable signal TRREN is activated, the reset state of the flip-flop circuits 52 to 54 is cancelled.

The flip-flop circuits 52 to 54 are cascade-connected in this order, and all of them carry out latch operations in synchronization with the precharge signal iPRE. An input node of the flip-flop circuit 52 is fixed to a high level. The output signal of the flip-flop circuit 52 is used as the state signal TRRST2, and the output signal of the flip-flop circuit 53 is used as the state signal TRRST3. The output signal of the flip-flop circuit 54 resets the flip-flop circuit 51 as described above.

Figure 5:
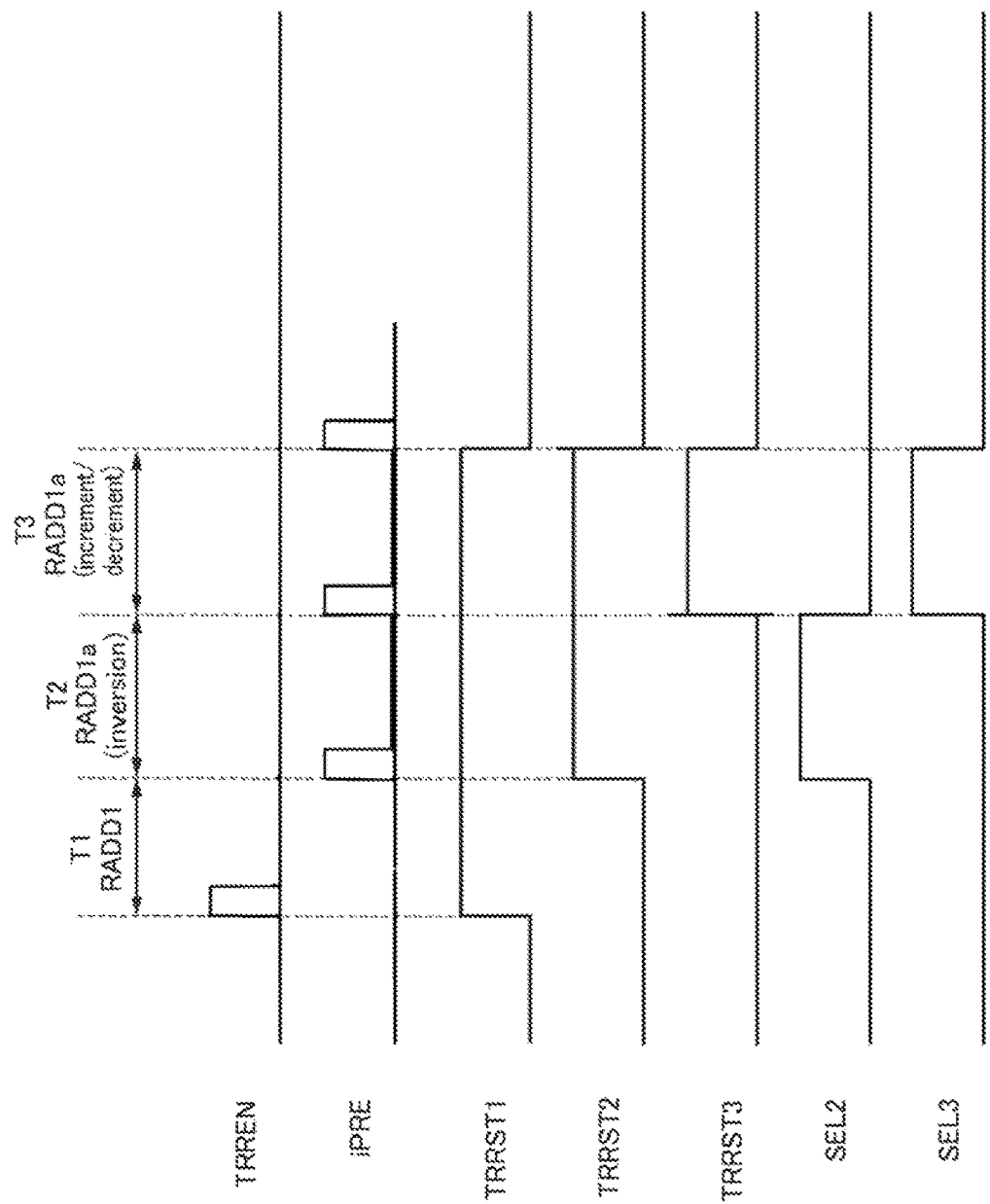
FIG. 5 is a timing diagram for explaining the operations of the state-signal generation circuit according to an embodiment of the present invention.

FIG. 5 is a timing diagram for explaining the operations of the state-signal generation circuit 34.

As shown in FIG. 5, when the target-row refresh enable signal TRREEN is activated, first, the state signal TRRST1 is activated. Then, the state signal TRRST2 is activated to the high level in response to the first precharge signal iPRE, the state signal TRRST3 is activated to the high level in response to the second precharge signal iPRE, and all of the state signals TRRST1 to TRRST3 are deactivated to the low level in response to the third precharge signal iPRE.

Figure 6:
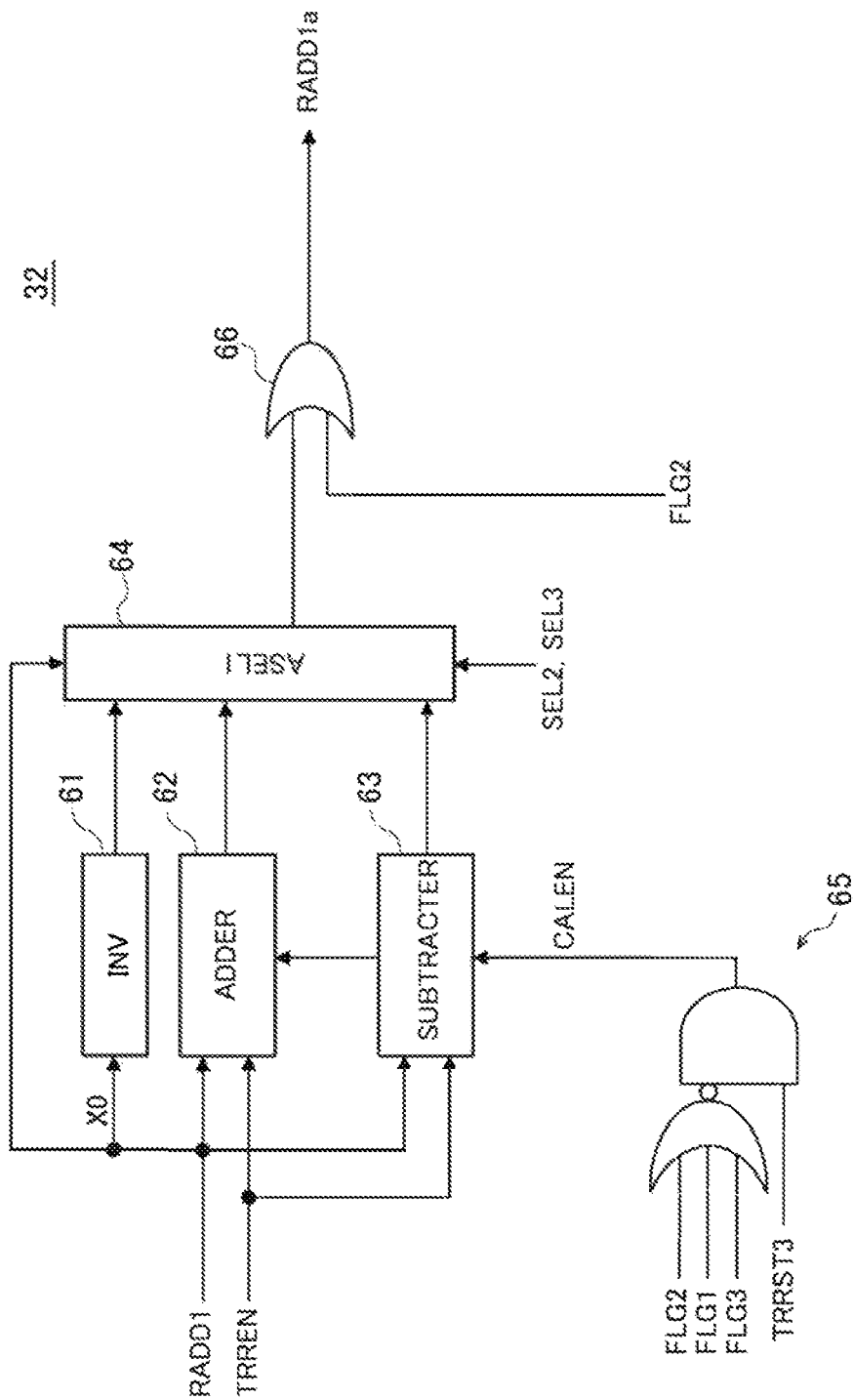
FIG. 6 is a circuit diagram of an address-control circuit according to an embodiment of the present invention.

FIG. 6 is a circuit diagram of the address control circuit 32.

As shown in FIG. 6, the address control circuit 32 includes an inversion circuit 61, which inverts the least significant bit X0 of the row address RADD1; an address adder circuit 62, which increments more significant bits Xn to X1 excluding the least significant bit X0 of the row address RADD1 by only 1 bit; and an address subtracter circuit 63, which decrements the more significant bits Xn to X1 excluding the least significant bit X0 of the row address RADD1 by only 1 bit. The row address RADD1 and the output signals from the circuits 61 to 63 are input to a selector 64.

If a calculation enable signal CALEN is activated to the high level, the address adder circuit 62 and the address subtracter circuit 63 executes the increment or the decrement and outputs the addition result or the subtraction result of the more significant bits Xn to X1 of the row address RADD1. If the calculation enable signal CALEN is deactivated to the low level, the address adder circuit 62 and the address subtracter circuit 63 output the more significant bits Xn to X1 of the row address RADD1 with no change without carrying out the increment or the decrement. The calculation enable signal CALEN is generated by a logic circuit 65 shown in FIG. 6. If the state signal TRRST3 is at the high level and all of flag signals FLG1 to FLG3 are deactivated to the low level, the logic circuit 65 activates the calculation enable signal CALEN to the high level.

If a selection signal SEL2 is activated, the selector 64 generates the row address RADD1a by synthesizing the more significant bits Xn to X1 of the row address RADD1 and the least significant bit X0 having a value inverted by the inversion circuit 61. If a selection signal SEL3 is activated, the selector 64 outputs the row address RADD1a by synthesizing the more significant bits Xn to X1 of the row address RADD1, which are output from the address adder circuit 62 or the address subtracter circuit 63, and the least significant bit X0 having a value inverted by the inversion circuit 61. Specifically, in a case in which the calculation enable signal CALEN is actuated to the high level, if the least significant bit X0 of the row address RADD1 is "1", the value obtained by synthesizing the more significant bits Xn to X1 of the row address RADD1 incremented by the address adder circuit 62 with the least significant bit X0 having the value inverted by the inversion circuit 61 is output as the row address RADD1a; and, if the least significant bit X0 of the row address RADD1 is "0", the value obtained by synthesizing the more significant bits Xn to X1 of the row address RADD1 decremented by the address subtracter circuit 63 with the least significant bit X0 having the value inverted by the inversion circuit 61. If the calculation enable signal CALEN is deactivated to the low level, both of the address adder circuit 62 and the address subtracter circuit 63 output the more significant bits Xn to X1 of the row address RADD1 with no change; therefore, the row address RADD1a output by the selector 64 is the row address in which only the least significant bit X0 is inverted among Xn to X0 of the row address RADD1.

Furthermore, OR gate circuits 66 are inserted to an output node of the selector 64. In FIG. 6, the OR gate circuit 66 is shown by one symbol mark. However, in practice, the OR gate circuits 66 are inserted respectively for the bits Xn to X0 of the row address RADD1a. The flag signal FLG2 is input to the OR gate circuits 66. Therefore, if the flag signal FLG2 is activated to the high level, the values of the row address RADD1a are forced to be maximum values, in other words, all of the values Xn to X0 become "1". The word line at which all of the values Xn to X0 are "1" corresponds to the normal word line WLN shown in FIG. 2.

Figure 7:
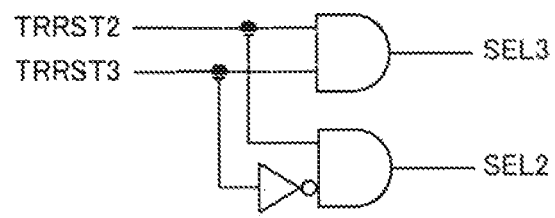
FIG. 7 is a circuit diagram of a logic circuit according to an embodiment of the present invention.

The selection signals SEL2 and SEL3 are generated by a logic circuit 60 shown in FIG. 7. The operations of the logic circuit 60 are shown in FIG. 5. The selection signal SEL2 is activated to the high level in the period from the first precharge signal iPRE to the second precharge signal iPRE, and the selection signal SEL3 is activated to the high level in the period from the second precharge signal iPRE to the third precharge signal iPRE.

Therefore, as shown in FIG. 5, in a period T1 between activation of the target-row refresh enable signal TRREN and generation of the first precharge signal iPRE, the row address RADD1 is output with no change as the row address RADD2. Then, in a period T2 between generation of the first precharge signal iPRE and generation of the second precharge signal iPRE, the row address RADD1a having the least significant bit X0 inverted by the inversion circuit 61 is output as the row address RADD2. Then, in a period T3 between generation of the second precharge signal iPRE and generation of the third precharge signal iPRE, if the calculation enable signal CALEN is at the high level, the row address RADD1a incremented by the address adder circuit 62 or the row address RADD1a decremented by the address subtracter circuit 63 is output as the row address RADD2. If the calculation enable signal CALEN is at the low level, as well as she second one, the row address RADD1a having the inverted least significant bit X0 is output as the row address RADD2.

However, the above described operations are the operations of the case in which all of the flag signals FLG1 to FLG3 are deactivated to the low level. If any of the flags FLG1 to FLG3 is at the high level, the operations different from those described above are executed. They will be described in detail later.

Returning to FIG. 3, the row address RADD2 output from the selector 31 is input to an address detection circuit 35 and the boundary detection circuit 36. The least significant bit X0 of the row address RADD2 is supplied also to the usage detection circuit 37.

The address detection circuit 35 judges whether the row address RADD2 is indicating the address of the normal word line WL that has a defect or not. The boundary detection circuit 36 judges whether the row address RADD2 is indicating the address of the normal word line WLN positioned at the end of the normal-word-line area A1 or not. The usage detection circuit 37 is a circuit which judges whether the redundant word line RWL adjacent to the redundant word line RWL serving as the target of the target-row refresh is used or not.

Figure 8:
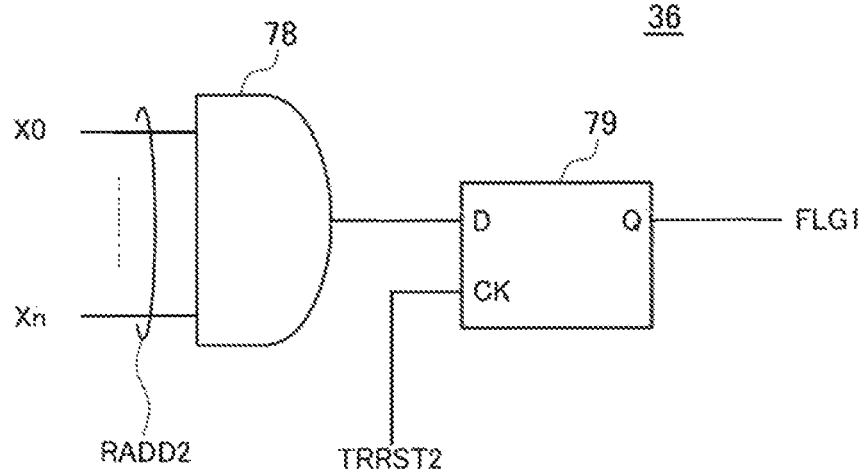
FIG. 8 is a circuit diagram of a boundary detection circuit according to an embodiment of the present invention.

FIG. 8 is a circuit diagram of the boundary detection circuit 36.

As shown in FIG. 8, the boundary detection circuit 36 includes an AND gate circuit 78, which receives the bits X0 to Xn constituting the row address RADD2, and a latch circuit 79, which latches the output of the AND gate circuit 78 in response to the state signal TRRST2. By virtue of such a configuration, if all of the values of the bits Xn to X0 constituting the row address RADD2 are "1", the flag signal FLG1, which is a boundary detection signal, is activated to the high level in response to the state signal TRRST2. More specifically, if the row address RADD2 corresponding to the normal word line WLN shown in FIG. 2 is input, the flag signal FLG1 becomes the high level in response to the state signal TRRST2.

Figure 9:
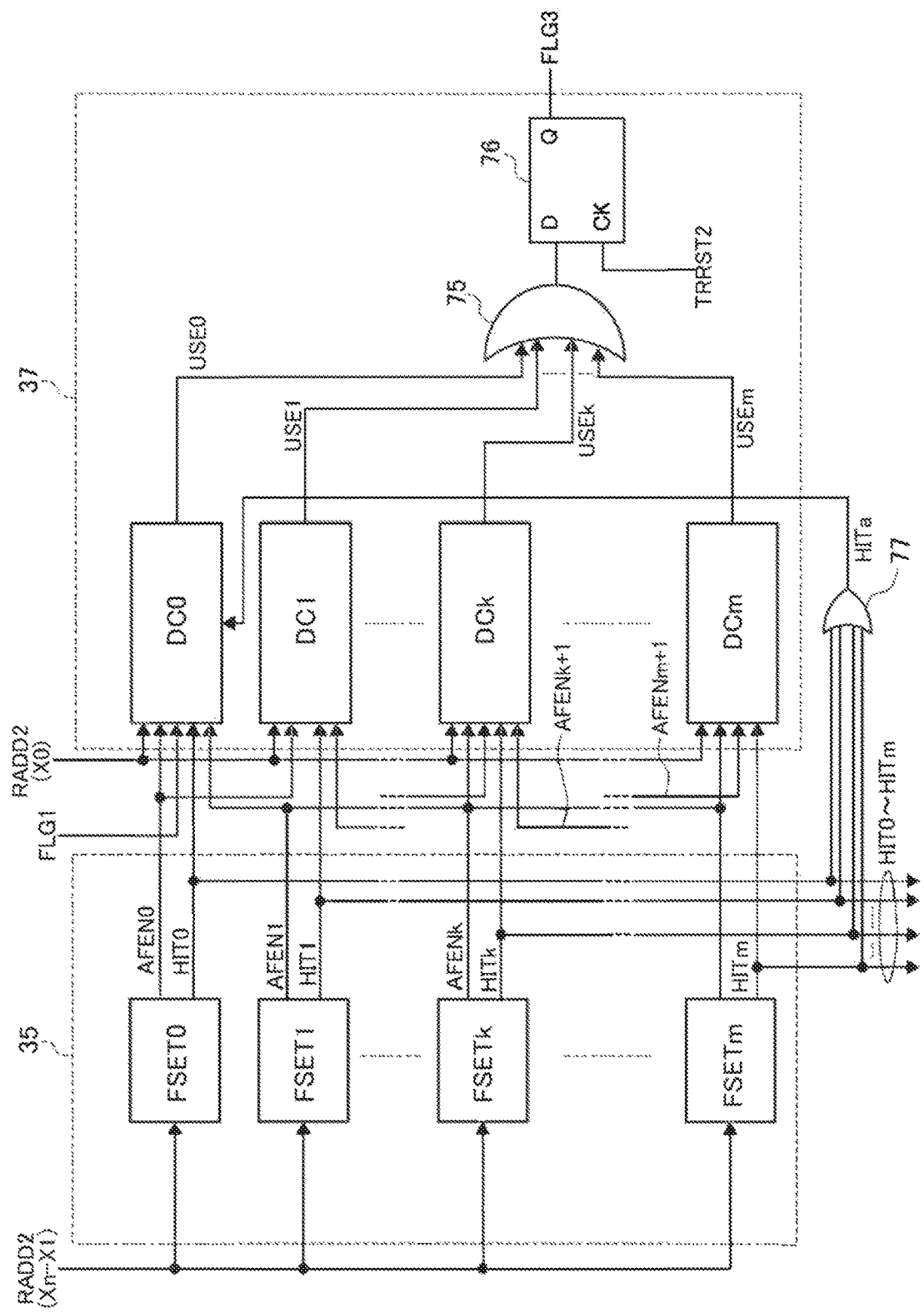
FIG. 9 is a block diagram showing a configuration of an address detection circuit and a usage detection circuit according to an embodiment of the present invention.

FIG. 9 is a block diagram showing a configuration of the address detection circuit 35 and the usage detection circuit 37.

As shown in FIG. 9, the address detection circuit 35 includes a plurality of fuse sets FSET0 to FSETm (defective address storing circuits). The fuse sets FSET0 to FSETm can store defective addresses respectively. If the input row address RADD2 matches the stored defective address, the corresponding one of the hit signals HIT0 to HITm is actuated to the high level.

The hit signals HIT0 to HITm are supplied to an encoder 38. If any of the hit signals HIT0 to HITm is activated, the encoder 38 generates a row address RADD3 by encoding the hit signal and supplies the row address to a selector 39.

If none of the hit signals HIT0 to HITm is activated, the selector 39 selects the row address RADD2 and supplies this to a row predecoder 41. On the other hand, if any of the hit signals HIT0 to HITm is activated, the selector 39 selects the row address RADD3 and supplies this to the row predecoder 41.

The row predecoder 41 controls a row decoder 42 by predecoding the row address RADD2 or RADD3. The row decoder 42 includes a normal-word-line row decoder and a redundant-word-line row decoder and selects the normal word line WL or the redundant word line RWL by completely decoding the row address RADD2 or RADD3. Specifically, if the selector 39 is selecting the row address RADD2, any of the normal word line WL is selected by the row decoder 42. On the other hand, if the selector 39 is selecting the row address RADD3, any of the redundant word line RWL is selected by the row decoder 42. The row predecoder 41 and the row decoder 42 constitute a word-line drive circuit.

Figure 10:
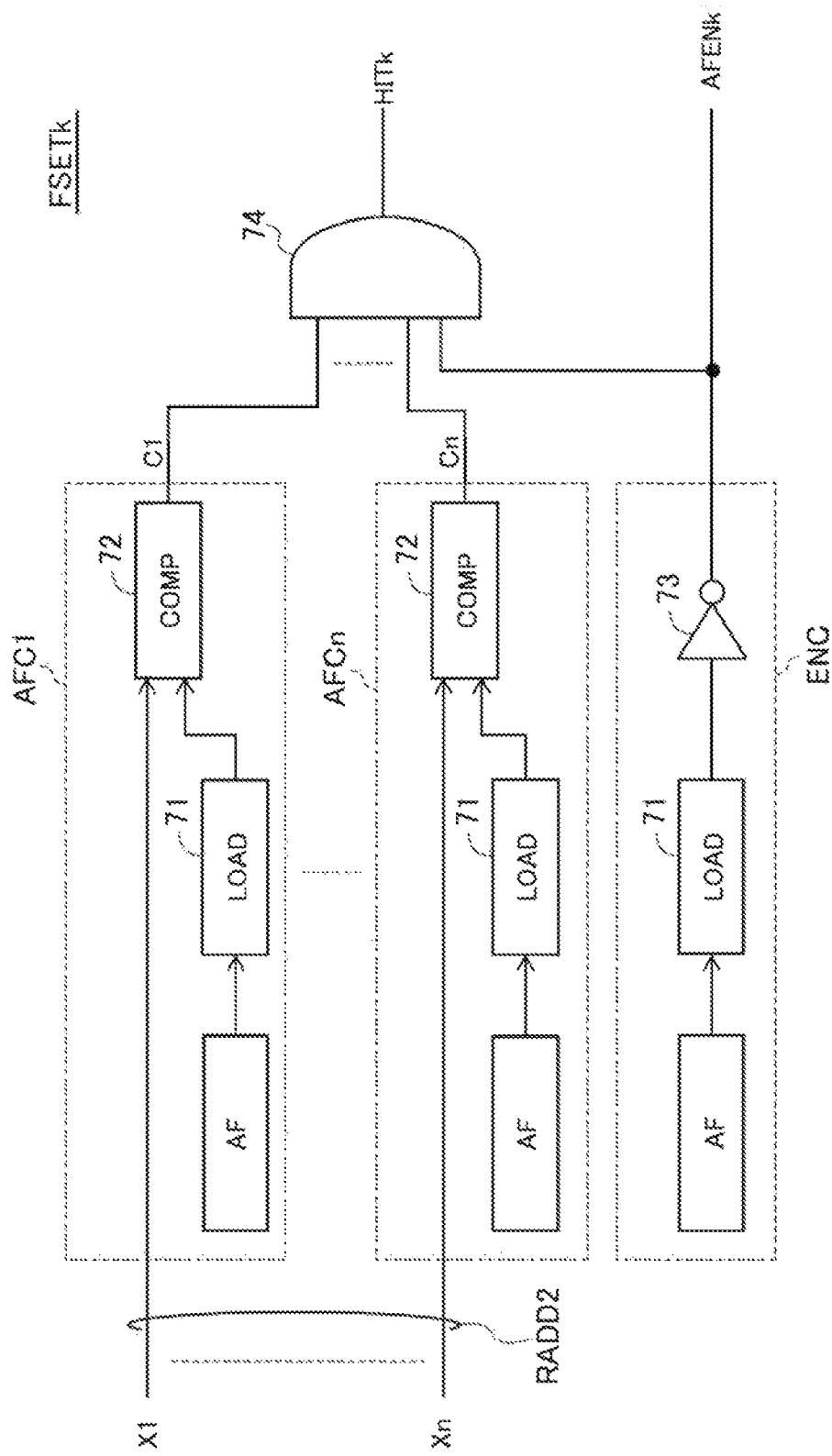
FIG. 10 is a circuit diagram of a fuse set according to an embodiment of the present invention.

FIG. 10 is a circuit diagram of the fuse set FSETk.

As shown in FIG. 10, the fuse set FSETk includes antifuse circuits AFC1 to AFCn (first storage unit) and an enable circuit ENC (second storage unit). The antifuse circuits AFC1 to AFCn are the circuits respectively corresponding to the bits X1 to Xn of the address RADD2, and each of them includes the antifuse element AF, a load circuit 71, and a comparison circuit 72. The antifuse circuit corresponding to the least significant bit X0 of the address RADD2 is not provided.

The antifuse element AF is an element which is insulated in an initial state and, when subjected to dielectric breakdown by a connect operation, makes a transition to a conductive state. The conductive state of the antifuse element AF is detected by the load circuit 71. If it is in an insulated state, the output of the load circuit 71 becomes the high level. If it is in a conductive state, the output of the load circuit 71 becomes the low level. The output of the load circuit 71 is input to the comparison circuit 72 and is compared with the logic level of the corresponding bit of the row address RADD2. If both of them match with each other, the comparison circuit 72 causes an output signal C1 to Cn to be the high level. Reversely, if both of them do not match with each other, the comparison circuit 72 causes the output signal C1 to Cn to be the low level.

The enable circuit ENC includes the antifuse element AF, a load circuit 71, and an inverter circuit 73. The enable circuit ENC is a circuit which indicates whether the fuse set FSETk is used or not. If used, the antifuse element AF of the enable circuit ENC is connected. As a result, if fuse set FSETk is used, an enable signal AFENk output from the enable circuit ENC becomes the high level.

The output signals C1 to Cn of the antifuse circuits AFC1 to AFCn and the enable signal AFENk are input to an AND gate circuit 74, which is a comparison unit. As a result, on the condition that the enable signal AFENk is activated to the high level, the hit signal HITk is activated when the bits X1 to Xn of the input row address RADD2 and the defective address stored in the fuse set FSETk completely match with each other.

The other fuse sets FSET0 to FSETm also have similar circuit configurations and generate the hit signals HIT0 to HITm, respectively.

The hit signals HIT0 to HITm are input to the encoder 38 as described above and are input also to the usage detection circuit 37 and an OR gate circuit 77. As shown in FIG. 9, the usage detection circuit 37 has detection circuits DC0 to DCm corresponding to the fuse sets FSET0 to FSETm. If at least any one of the hit signals HIT0 to HITm is at the high level, the OR gate circuit 77 activates a Hit signal HITa to the high level. The hit signal HITa is supplied to the detection circuit DC0 of the usage detection circuit 37.

Figure 11:
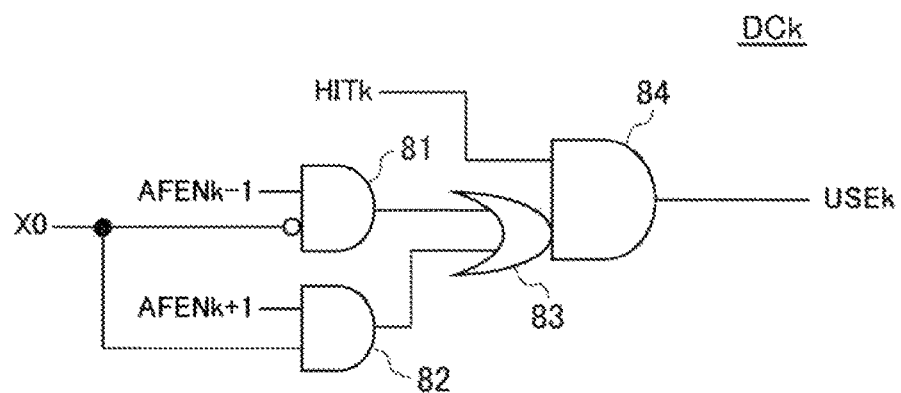
FIG. 11 is a circuit diagram of a detection circuit according to an embodiment of the present invention.

FIG. 11 is a circuit diagram of the detection circuit DCk.

As shown in FIG. 11, the detection circuit DCk includes an AND gate circuit 81, which receives the enable signal AFENk−1 and the inverted signal of the least significant bit X0 of the row address RADD2; an AND gate circuit 82, which receives the enable signal AFENk+1 and the least significant bit X0 of the row address RADD2; an OR gate circuit 83, which receives the output signals of the AND gate circuits 81 and 82; and an AND gate circuit 84, which receives the hit signal HITk and the output signal of the OR gate circuit 83. By virtue of this configuration, in a case in which the hit signal HITk is activated to the high level, if the least significant bit X0 of the row address RADD2 is at the low level and the enable signal AFENk−1 is at the high level, or if the least significant bit X0 of the row address RADD2 is at the high level and the enable signal AFENk+1 is at the high level, a usage detection signal USEk is activated to the high level.

The usage detection signal USEk indicates that the redundant word line RWL different from and adjacent to the redundant word line RWL to be accessed based on the hit signal HITk is used. The other detection circuits DC1 to DCm−1 excluding the detection circuits DC0 and DCm positioned at both ends also base the circuit configurations similar to that of the detection circuit DCk shown in FIG. 10. More specifically, the AND gate circuit 81 receives the enable signal AFEN of the fuse set FSET which is immediately therebefore, and the AND gate circuit 82 is configured to receive the enable signal AFEN of the fuse set FSET which is immediately thereafter.

Figure 12:
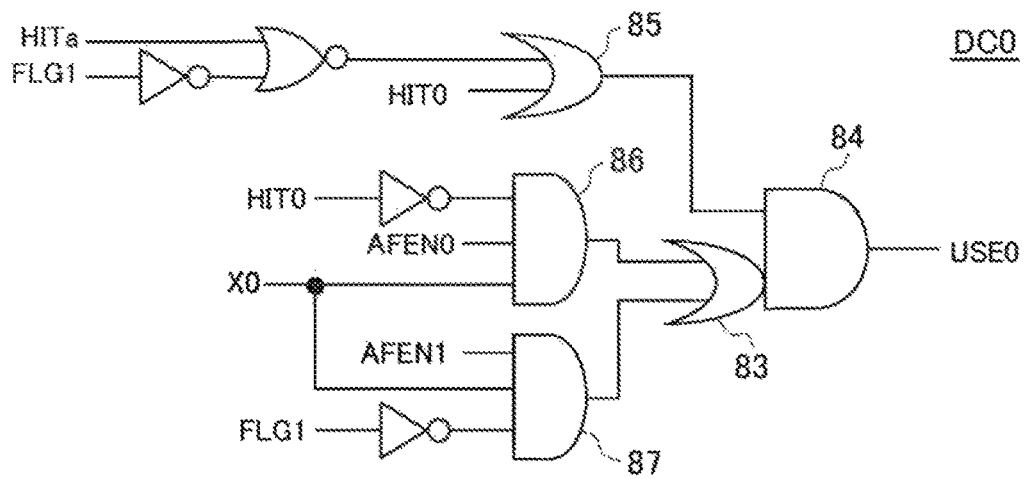
FIG. 12 is a circuit diagram of a detection circuit according to an embodiment of the present invention.

On the other hand, the detection circuit DC0 corresponding to the fuse set FSET0, in other words, the redundant word line RWL0 adjacent to the normal word line WLN and the detection circuit DCm corresponding to the fuse set FSETm have the circuit configurations different from that of the detection circuit DCk shown in FIG. 11. FIG. 12 is a circuit diagram of the detection circuit DC0.

As shown in FIG. 12, in the detection circuit DC0, OR gate circuits 85 and 88 are added, and the AND gate circuits 81 and 82 are replaced by AND gate circuits 86 and 87. The OR gate circuit 88 receives the hit signal HITa supplied from the OR gate circuit 77 of FIG. 7 and the inverted signal of the flag signal FLG1 and supplies the output thereof to the OR gate circuit 85. The OR gate circuit 85 receives the output signal of the OR gate circuit 88 and the hit signal HIT0 and the hit signal HIT0 and supplies the output thereof to the AND gate circuit 84. The AND gate circuit 86 receives she enable signal AFEN0, the inverted signal of the hit signal HIT0, and the least significant bit X0 of the row address RADD2. Furthermore, the AND gate circuit 87 receives the enable signal AFEN1, the inverted signal of the flag signal FLG1, and the least significant bit X0 of the row address RADD2. The other configuration thereof has the same circuit configuration as that of the detection circuit DCk shown in FIG. 11.

By virtue of this configuration, in a case in which the hit signal HIT0 is at the high level and the flag signal FLG1 is at the low level, if the least significant bit X0 of the row address RADD2 is at the high level and the enable signal AFEN1 is at the high level, a usage detection signal USE0 is activated to the high level. In a case in which the hit signal HITa is at the low level, in other words, all of the hit signals HIT0 to HITm are at the low level and the flag signal FLG1 is at the high level, if the least significant bit X0 of the row address RADD2 is at the high level and the enable signal AFEN0 is at the high level, the usage detection signal USE0 is activated to the high level. Even in the case in which the flag signal FLG1 is at the high level, if the hit signal HITa is at the high level in other words, any of the hit signals HIT0 to HITm is at the high level, the usage signal USE0 is not activated.

FIG. 11 is a circuit diagram of the detection circuit DCm.

Figure 13:
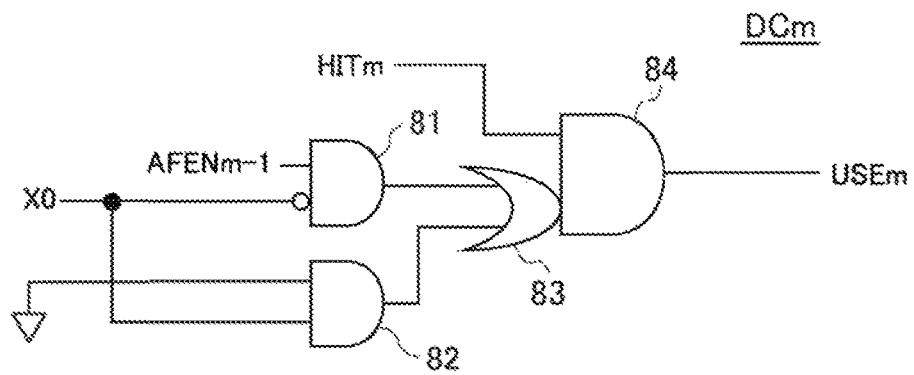
FIG. 13 is a circuit diagram of a detection circuit according to an embodiment of the present invention.

As shown in FIG. 13, the detection circuit DCm is different from the detection circuit DCk shown in FIG. 11 in a point that one of the input nodes of the AND gate circuit 82 is fixed to the low level. The other configuration has the same circuit configuration as that of the detection circuit DCk shown in FIG. 11.

By virtue of this configuration, when the hit signal HITm is activated to the high level, only if the least significant bit X0 of the row address RADD2 is at the low level and the enable signal AFENm−1 is at the high level, a detection signal USEm is activated to she high level.

The usage detection signals USE0 to USEm generated in this manner are input to a latch circuit 76 via an OR gate circuit 75. Since the latch circuit 76 carries out a latch operation in synchronization with the state signal TRRST2, if any of the usage detection signals USE0 to USEm is at the high level, the flag signal FLG3 is activated to the high level in synchronization with the state signal TRRST2.

Figure 14:
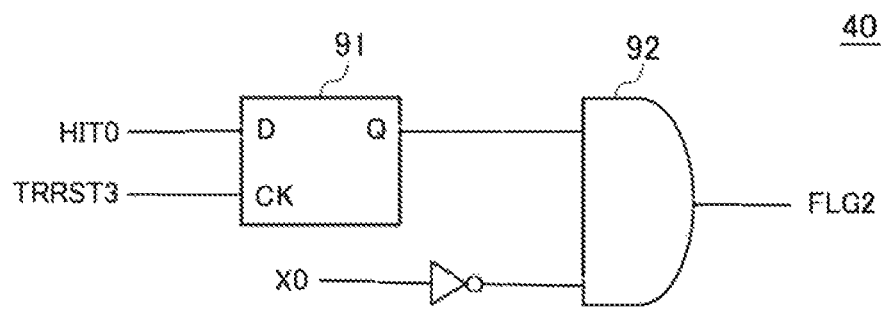
FIG. 14 is a circuit diagram of a boundary detection circuit according to an embodiment of the present invention.

FIG. 14 is a circuit diagram of the boundary detection circuit 40.

As shown in FIG. 14, the boundary detection circuit 40 includes a latch circuit 91, which latches the hit signal HIT0 in synchronization with the state signal TRRST3; and an AND circuit 92, which receives the output signal of the latch circuits 91 and the inverted signal of the least significant bit X0 of the row address. By virtue of this configuration, if the hit signal HIT0 is at the high level and the least significant bit X0 of the row address is "0", the flag signal FLG2, which is the boundary detection signal, is activated to the high level in synchronization with the state signal TRRST3.

Figure 15:
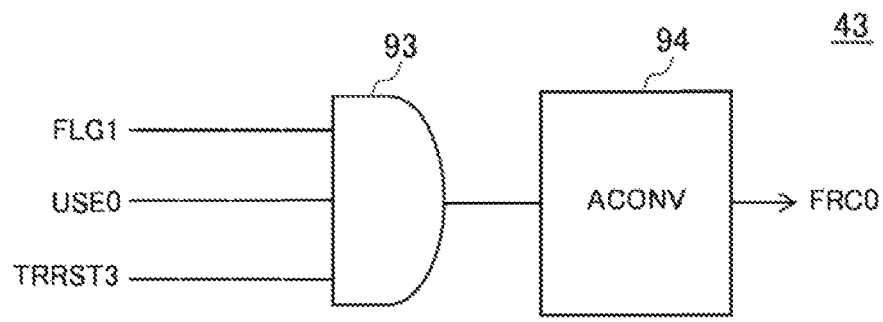
FIG. 15 is a circuit diagram of an address conversion circuit contained in a row predecoder according to an embodiment of the present invention.

FIG. 15 is a circuit diagram of the address conversion circuit 43 contained in the row predecoder 41.

As shown in FIG. 15, the address conversion circuit 43 includes an AND gate circuit 93, which receives the flag signal FLG1, the usage detection signal USE0, and the state signal TRRST3; and a switch circuit 94, which is activated by the output signal of the AND gate circuit 93. If the output signal of the AND gate circuit 93 becomes the high level, the switch circuit 94 activates a switch signal FRC0. If the switch signal FRC0 is activated, regardless of the values of the row addressee RADD2 and RADD3 input from the selector 39, the redundant word line RWL0 is forcibly selected by the row decoder 42. Therefore, if both of the flag signal FLG1 and the usage detection signal USE0 are activated, the redundant word line RWL0 is forcibly selected in response to the state signal TRRST3.

Figure 16:
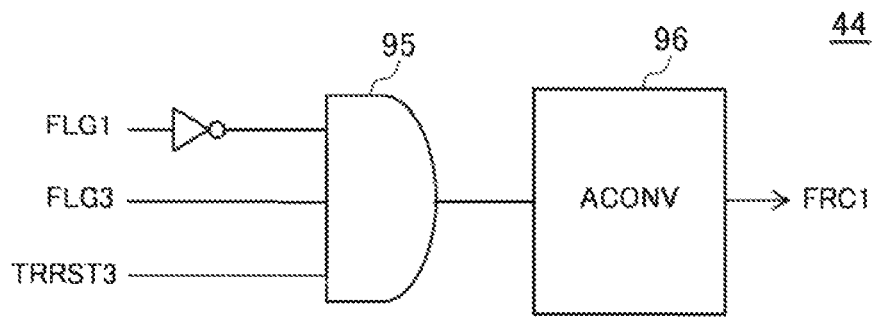
FIG. 16 is a circuit diagram of an address conversion circuit contained in the row predecoder according to an embodiment of the present invention.

FIG. 16 is a circuit diagram of the address conversion circuit 44 contained in the row predecoder 41.

As shown in FIG. 16, the address conversion circuit 44 includes an AND gate circuit 95, which receives the inverted signal of the flag signal FGL1, the flag signal FLG3, and the state signal TRRST3; and a switch circuit 96, which is activated by the output signal of the AND gate circuit 95. If the output signal of the AND gate circuit 95 becomes the high level, the switch circuit 96 activates a switch signal FRC1. If the switch signal FRC1 is activated, the value of the row address RADD3 input from the selector 39 is changed, and among the redundant word lines RWL adjacent to the redundant word line RWL corresponding to the row address RADD3, the redundant word line RWL in the opposite side of the redundant word line RWL at which only the least significant bit RX0 of the replacement addresses Rxn to RX0 is different is forcibly selected. Therefore, if the flag signal FLG1 is deactivated and the flag signal FLG3 is activated, the redundant word line RWL adjacent to the redundant word line RWL corresponding to the row address RADD3 is selected in response to the state signal TRRST3.

The circuit configuration of the semiconductor device 10 according to the present embodiment is as described above. Next, the operations of the semiconductor device 10 according to the present embodiment will be explained for each case with reference to FIG. 17 to FIG. 22.

[Case 1]

Figure 17:
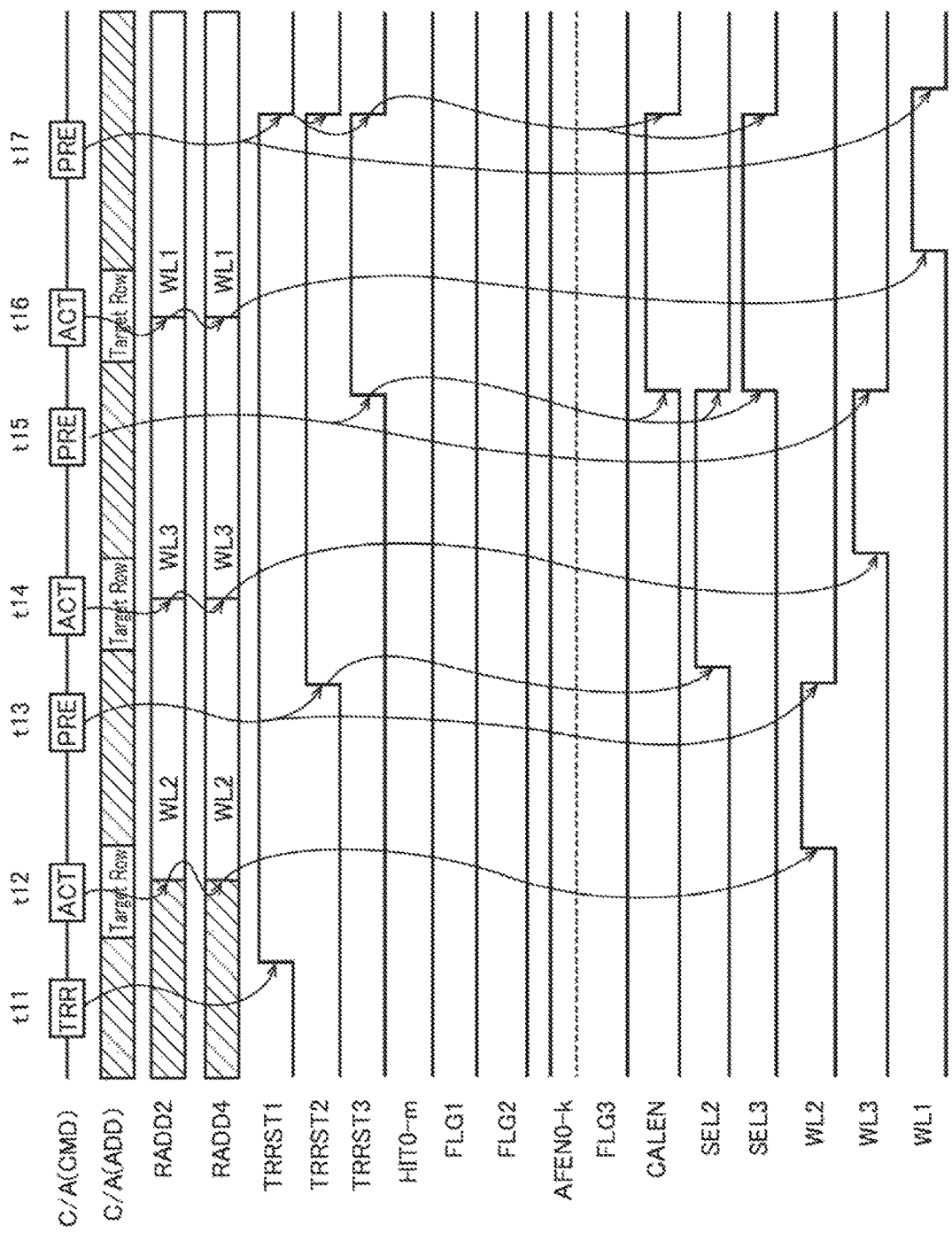
FIG. 17 is a timing chart showing target-row refresh operations in a case 1.

FIG. 17 is a timing chart for explaining the target-row refresh operations in the case 1. The case 1 is that access has been repeated with respect to a normal word line WLi (for example, the normal word line WL2 shown in FIG. 2), the target-row refresh operations are executed with respect to normal word lines WLi−1 and WLi+1 (for example, WL1 and WL3) adjacent thereto. In other words, this is a case in which all of the word lines serving as the cause of the target-row refresh operations and the word lines serving as the targets of the target-row refresh operations belong to the normal-word line area A1.

In FIG. 17, the address output from the row predecoder 41, in other words, the address of the normal word line WL or the redundant word line RWL which is actually accessed is described as RADD4. This point is similar also in below FIG. 18 to FIG. 22.

First, if the number of access with respect to the certain normal word line WLi (for example, the normal word line WL2) exceeds a predetermined value, a target-row refresh command TRR is issued from an external controller (time t11). As a result, the target-row refresh enable signal TRREN output from the mode register 27 is activated. Therefore, the state signal TRRST1 becomes the high level.

In this state, a first target-row refresh operation is carried out in a below manner. First, the target address, in other words, the row address of the normal word line WLi, in other words, the target address (described as "Target Row" in FIG. 17) is input together from an active command ACT from the controller (time t12). As a result, the command decoder 25 activates the active signal iACT. Therefore, the row control circuit 28 executes row access.

Since the state signals TRRST2 and TRRST3 are at the low level at this point of time, the selector 31 shown in FIG. 3 selects the row address RADD1 (target address) input from outside, and this is output as the row address RADD2. The row address RADD2 is input to the address detection circuit 35. However, in the present case, the target address is not a defective address, and none of the hit signals HIT0 to HITm are therefore activated. Moreover, since the normal word line WL indicated by the target address is not the normal word line WLN adjacent to the redundant-word-line area A2 in the present case, the flag signal FLG1 is also at the low level. Furthermore, since none of the hit signals HIT0 to HITm are activated, the flag signals FLG2 and FLG3 are also at the low level.

Therefore, the row predecoder 41 and the row decoder 42 select the normal word line WLi indicated by the target address input from outside, and the normal memory cells MC connected thereto are refreshed. Then, when a precharge command PRE is issued, the precharge signal iPRE is generated by the command decoder 25, and the state signal TRRST2 is changed to the high level (time t13). As a result, the selection signal SEL2 also becomes the high level.

The first target-row refresh operation is completed as described above in this manner, in the first target-row refresh operation, the normal word line WLi indicated by the target address is selected. FIG. 17 shows the case in which the target address corresponds to the normal word line WL2.

Then, a second target-row refresh operation is carried out. First, the target address is input again together with an active command ACT from the controller (time t14). As a result, the row control circuit 28 executes row access again. However, since the state signal TRRST2 is at the high level at this point of time, the selector 31 selects the row address RADD1a output from the address control circuit 32 and outputs that as the row address RADD2. Since the selection signal SEL2 is activated to the high level, the address control circuit 32 inverts the least significant bit X0 of the input target address and outputs this as the row address RADD1a.

The more significant bits Xn to X1 of the row address RADD2 generated in this manner excluding the least significant bit X0 are the same as the more significant bits Xn to X1 of the target address. Therefore, as a matter of course, none of the hit signals HIT0 to HITm are activated.

Therefore, the row predecoder 41 and the row decoder 42 select the normal word line WLi−1 or WLi+1 (for example, the normal word line WL3) adjacent to one side of the normal word line WLi indicated by the target address input from outside, and the normal memory cells MC connected thereto are refreshed. Then, when a precharge command PRE is issued, the state signal TRRST3 is changed to the high level (time t15). As a result, the selection signal SEL3 becomes the high level instead of the selection signal SEL2.

The second target-row refresh operation is completed as described above. In this manner, in the second target-row refresh operation, the normal word line WLi−1 or WLi+1 adjacent to the one side of the normal word line WLi indicated by the target address is selected. The normal word line WLi and the normal word line WLi−1 or WLi+1 are the word lines at which only the least significant bits X0 are different.

Then, a third target-row refresh operation is carried out. First, the target address is input again together with an active command ACT from The controller (time t16). As a result, the row control circuit 28 executes row access again. However, since the state signal TRRST3 is at the high level at this point of time, the selector 31 selects the row address RADD1a output from the address control circuit 32 and outputs this as the row address RADD2. At this point, the selection signal SEL3 is activated to the high level, and all of the flag signals FLAG1 to 3 are deactivated to the low level. Therefore, the calculation enable signal CALEN is activated to the high level. As a result, the address control circuit 32 increments or decrements the more significant bits Xn to X0 of the input target address, synthesizes this with the inverted least significant bit X0, and outputs this as the row address RADD1a.

The more significant bits Xn to X1 of the target address are decremented by the address control circuit 32 when the least significant bit X0 of the target address is "0". Reversely, the more significant bits Xn to X1 of the target address are incremented by the address control circuit 32 when the least significant bit X0 of the target address is "1". Therefore, if the word line indicated by the target address is the normal word line WL2, the target address is decremented, and the row address RADD2 indicating the normal word line WL1 is generated.

Note that the present example is explained on the assumption that the normal word line WLi−1 or WLi+1 is not defective, and, therefore, replacement by the redundant word line RWL is not carried out. Therefore, also in the third target-row refresh operation, the hit signals HIT0 to HITm are not activated.

As a result, the row predecoder 41 and the row decoder 42 select the normal word line WLi−1 or WLi+1 adjacent to the other side of the normal word line WLi indicated by the target address input from outside, and the normal memory cells MC connected thereto are refreshed. Then, when a precharge command PRE is issued, all of the state signals TRRST1 to TRRST3 are changed to the low level (time t17).

The third target-row refresh operation is completed as described above. In this manner, in the third target-row refresh operation, the normal word line WLi−1 or WLi+1adjacent to the other side of the normal line WLi indicated by the target address is selected.

In this manner, in the case 1, the normal word line WLi indicated by the target address, the normal word line WLi+1 adjacent to the one side of the normal word line WLi, and the normal word line WLi+1 adjacent to the other side of the normal word line WLi are sequentially selected. As a result, the reduced information retention time are recovered.

Note that the above described example is explained on the assumption that the normal word lines WLi+1 and WLi+1 are not defective. However, if the normal word line WLi−1 or WLi+1 is defective and replaced by the redundant word line RWL, the redundant word line RWL of a replacement destination is selected in the third target-row refresh operation. However, this operation is not essential.

[Case 2 (Number 1)]

Figure 18:
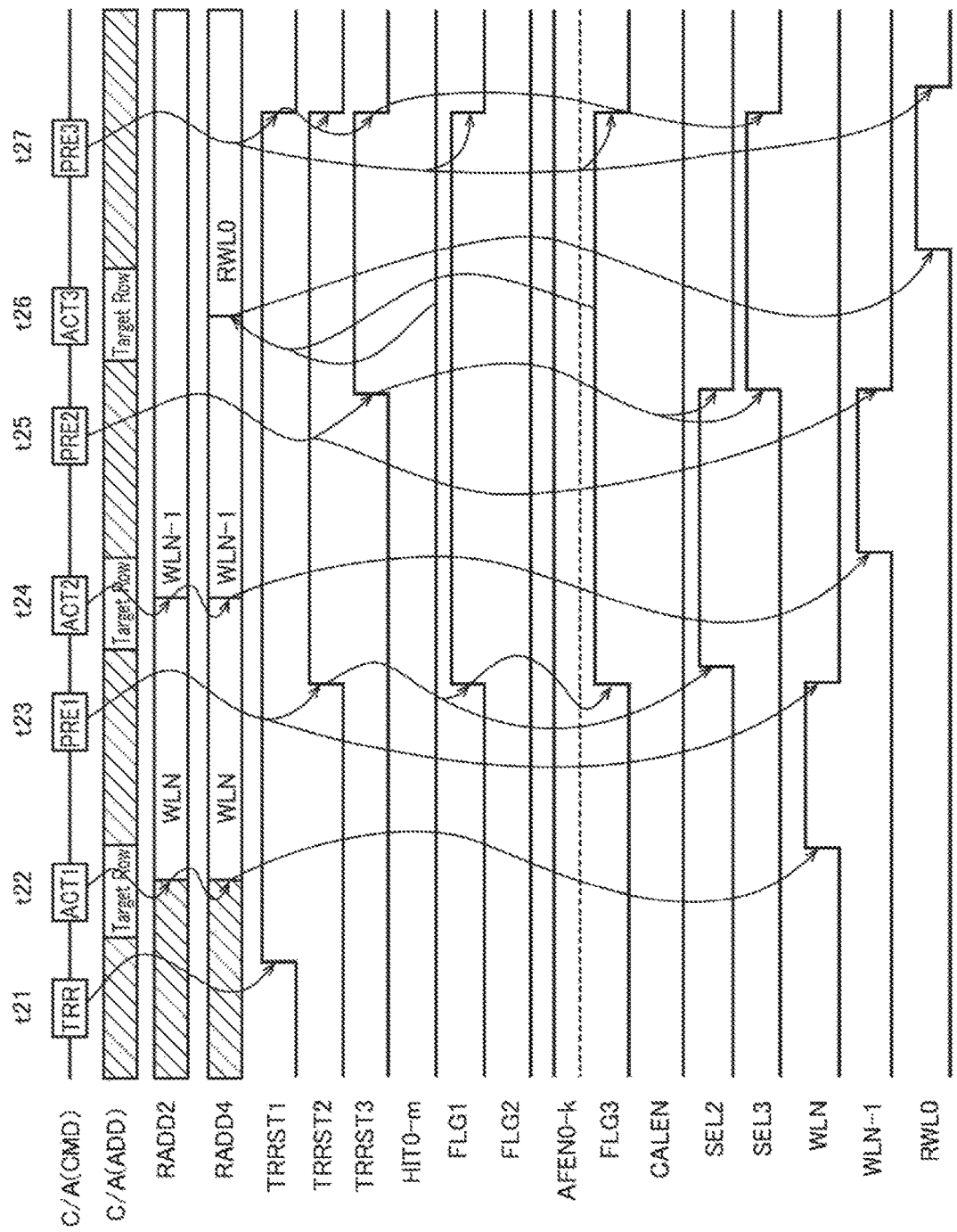
FIG. 18 is a first timing chart showing target-row refresh operations in a case 2.

FIG. 18 is a first timing chart for explaining the target-row refresh operations in the case 2. The case 2 is that access with respect to the normal word line WLN adjacent to the redundant-word-line area A2 has been repeated, the target-row refresh operations are executed with respect to the normal word line WLN−1 and the redundant word line RWL0 adjacent thereto. More specifically, this is the case in which the word line serving as the cause of the target-row refresh operations belongs to the normal-word-line area A1, one of the word lines serving as the target of the target-row refresh operation belongs to the normal-word-line area A1, and the other one belongs to the redundant-word-line area A2. In this case, it is assumed that the normal word line WLN is not defective. Herein, in the case 2, a case in which the redundant word line RWL0 is used is explained.

First, when the number of access with respect to the normal word line WLN exceeds a predetermined value, a target-row refresh command TRR is issued from the external controller (time t21). As a result, the target-row refresh enable signal TRREN output from the mode register 27 is activated. Therefore, the state signal TRRST1 becomes the high level.

In this state, a first target-row refresh operation is carried out in the below manner. First, the target address, in other words, the row address of the normal word line WLN is input together with an active command from the controller (time t22). The operation related thereto is as explained by using FIG. 17, wherein the normal word line WLN indicated by the target address input from outside is selected, and the normal memory cells MC connected thereto are refreshed.

However, in the case 2, all of the values indicating the normal word line WLN by the target address, in other words, the values of Xn to X0 are "1". Therefore, the AND gate circuit 78 contained in the boundary detection circuit 36 is outputting the high level.

Then, when a precharge command PRE is issued, the state signal TRRST2 and the selection signal SEL2 are changed to the high level (time t23). As a result, the latch circuit 79 contained in the boundary detection circuit 36 latches the signal at the high level. Therefore, the flag signal FL G1 is activated to the high level.

The first target-row refresh operation is completed as described above. In this manner, in the first target-row refresh operation, the normal word line WLN indicated by the target address is selected.

Then, a second target-row refresh operation is carried out. First, the target address is input again together with an active command ACT from the controller (time t24). The operation related thereto is as explained by using FIG. 17, wherein the row address RADD2 having the inverted least significant bit X0 of the target address input from outside is generated, and the normal word line WLN−1 corresponding thereto is selected.

Then, when a precharge command PRE is issued, the state signal TRRST3 and the selection signal SEL3 are changed to the high level (time t25).

The second target-row refresh operation is completed as described above. In this manner, in the second target-row refresh operation, the normal word line WLN−1 adjacent to one side of the normal word line WLN indicated by the target address is selected. The normal word line WLN and the normal word line WLN−1 are the word lines at which only the least significant bits X0 are different.

Then, a third target-row refresh operation is carried out. First, the target address is input again together with an active command ACT from the controller (time t26). As a result, the row control circuit 28 executes row access again. In the present case, since the flag signal FLG1 is activated to the high level at this point of time, the calculation enable signal CALEN is fixed to the low level. Therefore, even if the state signal TRRST3 is changed to the high level, increment or decrement by the address control circuit 32 is forbidden, and the row address RADD2 having the inverted least significant bit X0 is output.

Since the normal word line WLN is not defective as described above, the hit signal HITa shown in FIG. 12 remains at the low level. Then, since the redundant word line RWL0 is used in the present example, the enable signal AFEN0 corresponding to the fuse set FSET0 is at the high level. Therefore, all of the inputs of the AND gate circuit 86 shown in FIG. 12 become the high level. Therefore, the usage detection signal USE0 becomes the high level. As a result, all of the usage detection signal USE0, the flag signal FLG1, and the state signal TRRST3 become the high level. Therefore, the address conversion circuit 43 shown in FIG. 15 activates the switch signal FRC0. As a result, regardless of the input row address RADD2, the redundant word line RWL0 is forcibly selected.

Then, when a precharge command is issued, all of the state signals TRRST1 to TRRST3 are changed to the low level (time t27).

The third target-row refresh operation is completed as described above. In this manner, in the third target-row refresh operation, the redundant word line RWL0 adjacent to the other side of the normal word line WLN indicated by the target address is selected.

If the redundant word line RWL0 is used in the case 2 in this manner, the normal word line WLN indicated in the target address, the normal word line WLN−1 adjacent to the one side of the normal word line WLN, and the redundant word line RWL0 adjacent to the other side of the normal word line WLN are sequentially selected.

[Case 2 (Number 2)]

Figure 19:
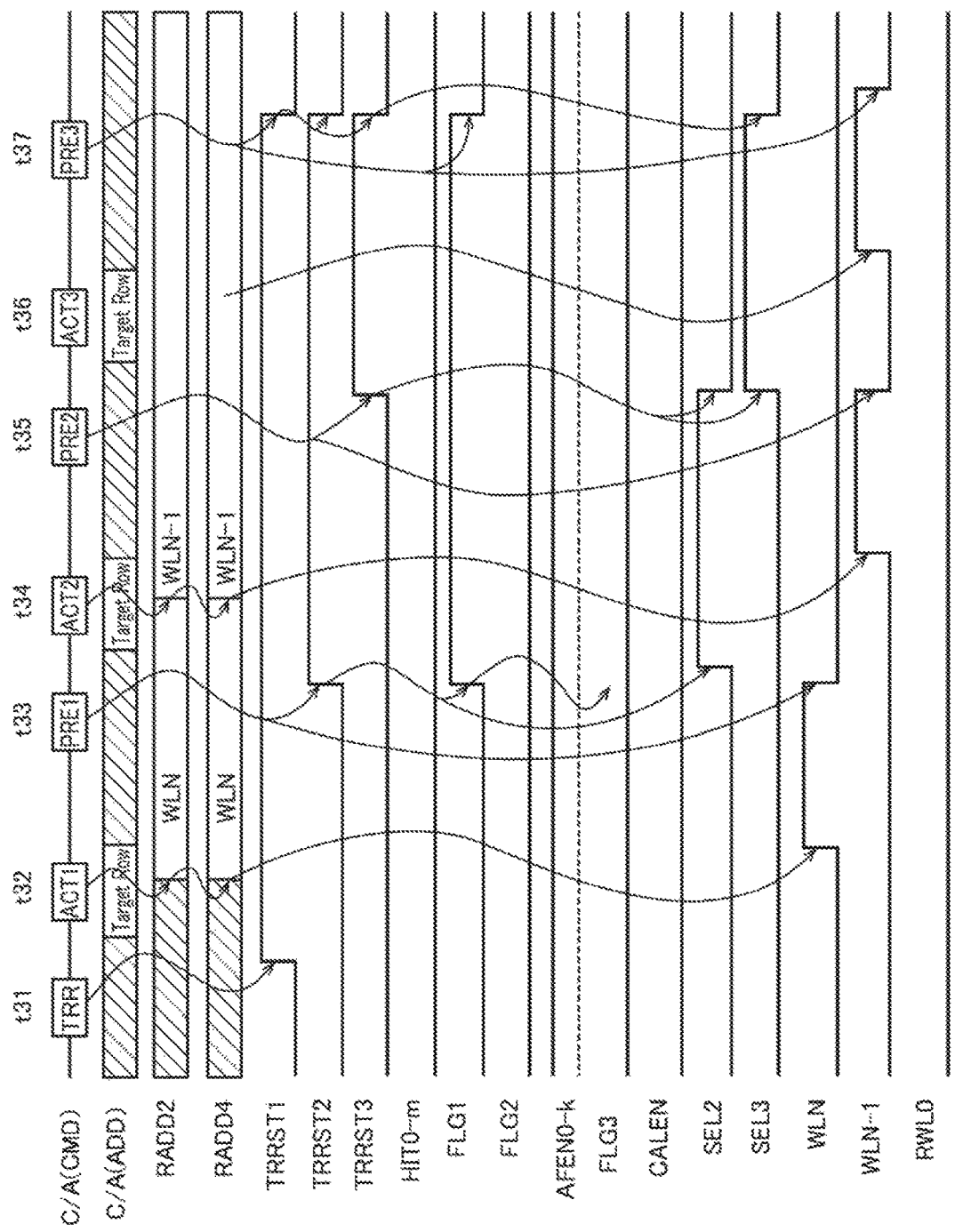
FIG. 19 is a second timing chart showing target-row refresh operations in a case 2.

FIG. 19 is a second timing chart for explaining the target-row refresh operations in the case 2. Herein, in the case 2, a case in which the redundant word line RWL0 is unused is explained.

The operations corresponding to time t31 to t35 are similar to those of FIG. 18. More specifically the normal word line WLN is selected in a first target-row refresh operation, and the normal word line WLN−1 is selected in a second target-row refresh operation.

Then, the target address is input in relation to a third target-row refresh operation (time t36). In the present example, since the redundant word line RWL0 is unused, the enable signal AFEN0 corresponding to the fuse set FSET0 is at the low level. As a result, the usage detection signal USE0 maintains the low level. Therefore, forcible address conversion by the address conversion circuit 43 is not carried out. In this case, also in the third target-row refresh operation, the normal word line WLN−1 is selected as well as the second time.

In this manner, if the redundant word line RWL0 is unused in the case 2, the normal word line WLN indicated by the target address and the normal word line WLN−1 adjacent to the one side of the normal word line WLN are sequentially selected, while the redundant word line RWL0 is not selected. As a result, unexpected erroneous operations caused by selecting the unused redundant word line RWL0 are prevented.

[Case 3]

Figure 20:
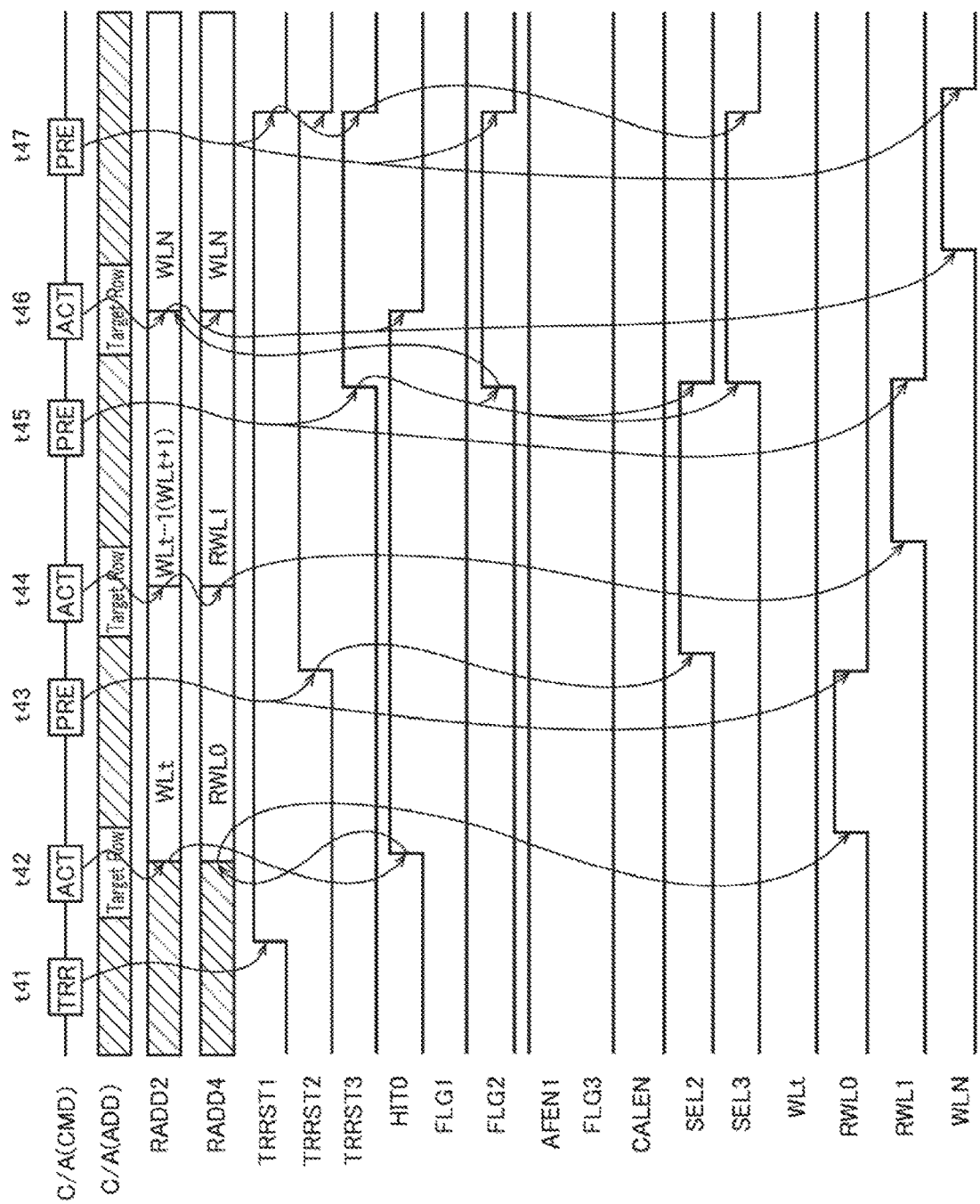
FIG. 20 is a timing chart showing target-row refresh operations in a case 3.

FIG. 20 is a timing chart for explaining the target-row refresh operations in the case 3. The case 3 is that access with respect to the redundant word line RWL0 adjacent to the normal-word-line area A1 has been repeated, the target-row refresh operations are executed with respect to the normal word line WLN and the redundant word line RWL1 adjacent thereto. More specifically, this is the case in which the word line serving as the cause of the target-row refresh operations belongs to the redundant-word-line area A2, one of the word lines serving as the targets of the target-row refresh operations belongs to the normal-word-line area A1, and the other one belongs to the redundant-word-line area A2.

First, a target-row refresh command TRR is issued (time t41), and the state signal TRRST1 becomes the high level. Then, the address of a defective word fine WLt, which is the replacement origin of the redundant word line RWL0, is input as the target address from the controller (time t42).

Since the state signals TRRST2 and TRRST3 are at the low level at this point of time, the selector shown in FIG. 3 selects the row address RADD1 (target address) input from outside and outputs this as the row address RADD2. The row address RADD2 is input to the address detection circuit 35. However, in the present case, the target address is a defective address, and the hit signal HIT0 is activated.

Herein, since the least significant bit X0 of the target address is "0", the row predecoder 41 and the row decoder 42 select the redundant word line RWL0 based on the hit signal HIT0 and the least significant bit X0 of the target address. Then, when a precharge command PRE is issued, the state signal TRRST2 and the selection signal SEL2 are changed to the high level (time t43).

The first target-row refresh operation is completed as described above. In this manner, in the first target-row refresh operation, the redundant word line RWL0, which is the replacement destination, is selected. Note that, even when the hit signal HIT0 is activated to the high level if the least significant bit X0 of the row address RADD2 is "0", the usage detection signal USE0 is not activated by the circuit configuration shown in FIG. 12.

Then, a second target-row refresh operation is carried out. First, the target address is input again together with an active command ACT from the controller (time t44). As a result, the row control circuit 28 executes row access again. However, since the state signal TRRST2 is at the high level at this point of time, the selector 31 selects the row address RADD1a output from the address control circuit 32 and outputs that as the row address RADD2. Since the selection signal SEL2 is activated to the high level, the address control circuit 32 inverts the least significant bit X0 of the input target address, and this is output as the row address RADD1a.

The more significant bits Xn to X1 of the row address RADD2 generated in this manner excluding the least significant bit X0 are the same as the more significant bits Xn to X1 of the target address. Therefore, as a matter of course, the hit signal HIT0 is activated.

Therefore, the row predecoder 41 and the row decoder 42 select the redundant word line RWL1 adjacent to one side of the redundant word line RWL0 based on the hit signal HIT0 and the least significant bit X0 of the target address. Then, when a precharge command is issued, the state signal TRRST3 and the selection signal SEL3 are changed to the high level (time t45). The second target-row refresh operation is completed as described above. In this manner, in the second target-row refresh operation, the redundant word line RWL1 in one side of the redundant word line RWL0, which is the replacement destination, is selected. The redundant word line RWL0 and the redundant word line RWL1 are the word lines at which only the least significant bits X0 are different.

Since the boundary detection circuit 40 latches the high-level hit signal HIT0 in response to activation of the state signal TRRST3, the flag signal FLG2 is changed to the high level.

Then, the target address is input in relation to a third target-row refresh operation (time t46). However, since the flag signal FLG2 is at the high level in the present example, all of the values of Xn to X0 of the row address RADD1a output from the address control circuit 32 become "1". The word line at which all of the values of Xn to X0 are "1" corresponds to the normal word line WLN shown in FIG. 2. As a result, in the third target-row refresh operation, regardless of the input target address, the normal word line WLN is selected. Note that the output signal of the AND gate circuit 78 contained in the boundary detection circuit 36 is at the high level. However, since the state signal TRRST2 is already at the high level at this point of time, the latch circuit 79 does not carry out a latch operation. Therefore, the flag signal FLG1 is maintained at the low level.

In this manner, in the case 3, the redundant word line RWL0, which is the replacement destination, the redundant word line RWL1 adjacent to the one side of the redundant word line RWL0, and the normal word line WLN adjacent to the other side of the redundant word line RWL0 are sequentially selected.

Note that, the above described example has been explained on die assumption that the normal word line WLN is not defective However, if the normal word line WLN is defective and replaced by the redundant word line RWL, the redundant word line RWL, which is the replacement destination, is selected in the third target-row refresh operation. However, this operation is not essential.

[Case 4 (Number 1)]

Figure 21:
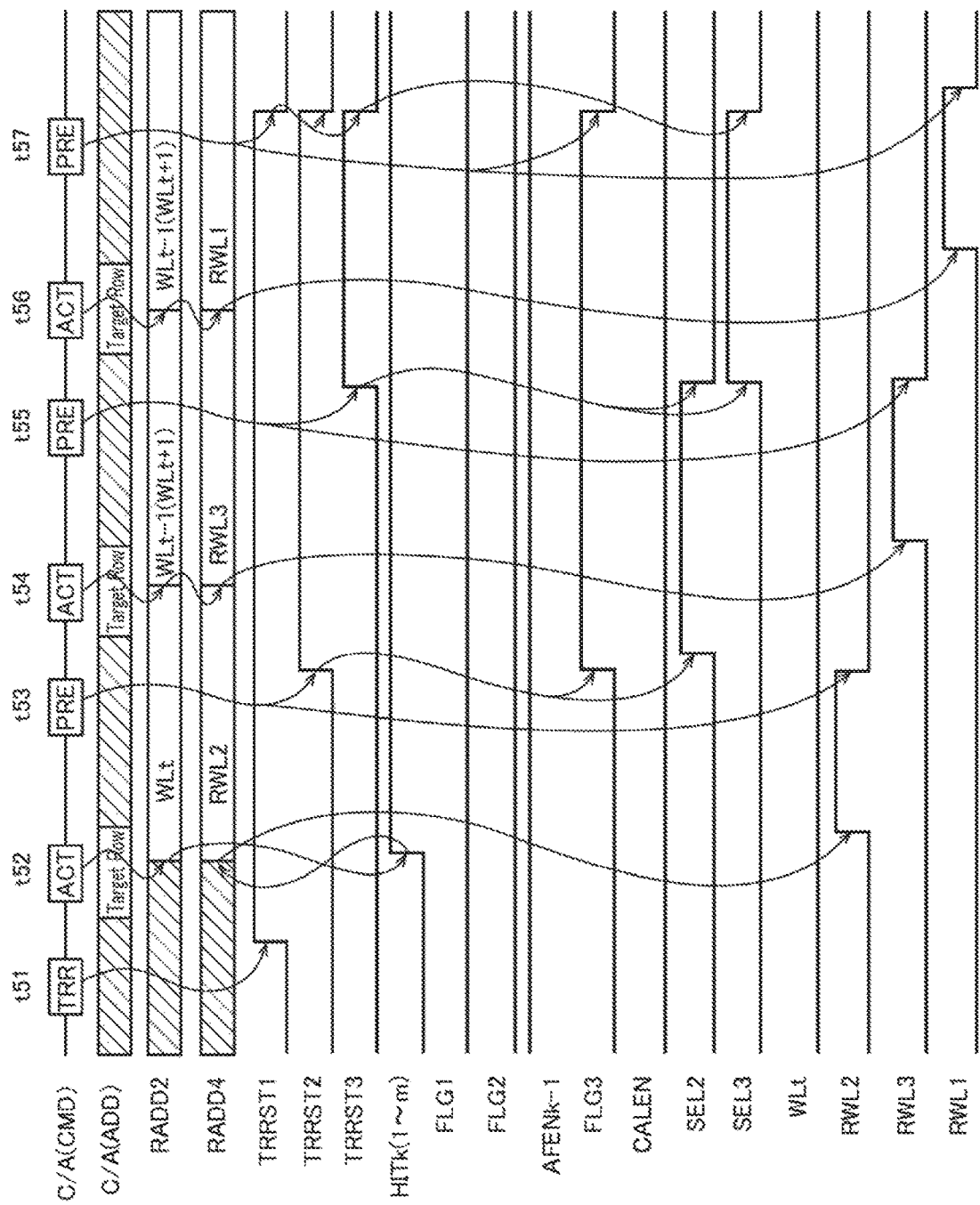
FIG. 21 is a first timing chart showing target-row refresh operations in a case 4.

FIG. 21 is a first timing chart for explaining target-row refresh operations in the case 4. The case 4 is that access with respect to the redundant word line RWLj (for example, the redundant word line RWL2 shown in FIG. 2) is repeated, the target-row refresh operations are executed with respect to redundant word lines RWLj−1 and RWLj+1 (for example, RWL1, RWL3) adjacent thereto. In other words, this is a case in which both of the word line serving as the cause of the target-row refresh operations and the word lines serving as the targets of the target-row refresh operations belong to the redundant-word-line area A2. Herein, in the case 4, a case in which both of the redundant word lines RWLj−1 and RWLj−1 are used is explained.

First, a target-row refresh command TRR is issued (time t51), and the state signal TRRST1 becomes the high level. Then, the address of a defective word line WLt, which is the replacement origin of the redundant word line RWLj (for example, the redundant word line RWL2), is input as a target address from the controller (time t52).

Since the state signals TRRST2 and TRRST3 are at the low level at this point of time, the selector 31 shown in FIG. 3 selects the row address RADD1 (target address) input from outside and outputs this as the row address RADD2. The row address RADD2 is input to the address detection circuit 35, and, since the target address is a defective address in the present case, the hit signal HITk is activated. As a result, the row predecoder 41 and the row decoder 42 select the redundant word line RWLj based on the hit signal HITk and the least significant bit X0 of the target address. Then, when a precharge command is issued, the state signal TRRST2 and the selection signal SEL2 are changed to the high level (time t53).

The first target-row refresh operation is completed as described above, in this manner, in the first target-row refresh operation, the redundant word line RWLj, which is a replacement destination, is selected. The redundant word line RWLj, which is the replacement destination, is, for example, the redundant word line RWL2.

Herein, the hit signal HITk is any of the hit signals HIT1 to HITm. Therefore, it is not the hit signal HIT0. For example, if the redundant word line RWLj is the redundant word line RWL2, the hit signal HIT1 is activated. In this case, the least significant bit X0 of the target address is "0".

Then, in the present example, since the redundant word lines RWLj−1 and RWLj+1 adjacent to the redundant word line RWLj are used, the enable signal AFENk−1 or AFENk+1 at the high level is input to the detection circuit DCk shown in FIG. 11. Therefore, the detection circuit DCk activates the usage detection signal USEk to the high level, and this is latched in response to the state signal TRRST2. Thus, the flag signal FLG3 becomes the high level.

Then, a second target-row refresh operation is carried out. First, the target address is input again together with an active command ACT from the controller (time t54). As a result, the row control circuit 28 executes row access again. However, since the state signal TRRST2 is at the high level at this point of time, the selector 31 selects the row address RADD1a output from the address control circuit 32 and outputs that as the row address RADD2. Since the selection signal SEL2 has been activated to the high level, the address control circuit 32 inverts the least significant bit X0 of the input target address and outputs this as the row address RADD1a.

The more significant bits Xn to X1 of the row address RADD2 generated in this manner excluding the least significant bit X0 are the same as the more significant bits Xn to X1 of the target address. Therefore, as a matter of course, the hit signal HITk is activated.

Therefore, the row predecoder 41 and the row decoder 42 select the redundant word line RWLj−1 or RWLj+1 (for example, the redundant word line RWL3) adjacent to one side of the redundant word line RWLj based on the hit signal HITk and the least significant bit X0 of the target address. Then, when a precharge command PRE is issued, the state signal TRRST3 and the selection signal SEL3 are changed to the high level (time t55).

The second target-row refresh operation is completed as described above. In this manner, in the second target-row refresh operation, the redundant word line RWLj−1 or RWLj+1 adjacent to one side of the redundant word line RWLj, which is the replacement destination, is selected. The redundant word line RWLj and the redundant word line RWLj−1or RWLj+1 are the word lines at which only the least significant bit X0 is different.

Then, a third target-row refresh operation is carried out. First, the target address is input again together with an active command ACT from the controller (time t56). As a result, the row control circuit 28 executes row access again. In the present case, since the flag signal FLG3 is activated to the high level at tins point of time, the calculation enable signal CALEN is fixed to the low level. Therefore, even if the state signal TRRST3 is changed to the high level, the increment or decrement by the address control circuit 32 is forbidden, and the row address RADD2 having the inverted least significant bit X0 is output.

Then, in the present example, since the flag signal FLG3 is at the high level and the flag signal FLG1 is at the low level, the address conversion circuit 44 shown in FIG. 16 activates the switch signal FRC1. As a result, the row decoder 42 forcibly selects the redundant word line RWL which is in the opposite side of the redundant word line RWL having the different least significant bit X0 of the row address among the redundant word lines RWL adjacent to the redundant word line RWLj. For example, if the input address is indicating the redundant word line RWL2, the redundant word line RWL1 is forcibly selected. As a result, the redundant word line RWLj−1 or RWLj+1 adjacent to the other side of the redundant word line RWLj is selected.

Then, when a precharge command PRE is issued, all the state signals TRRST1 to TRRST3 are changed to the low level (time t57).

The third target-row refresh operation is completed as described above.

In this manner, if the adjacent redundant word lines RWLj−1 and RWLj+1 are used in the case 4, the redundant word line RWLj, which is the replacement origin, the redundant word line RWLj−1 adjacent to the one side of the redundant word line RWLj, and the normal word line WLj+1 adjacent to the other side of the redundant word line RWLj are sequentially selected.

[Case 4 (Number 2)]

Figure 22:
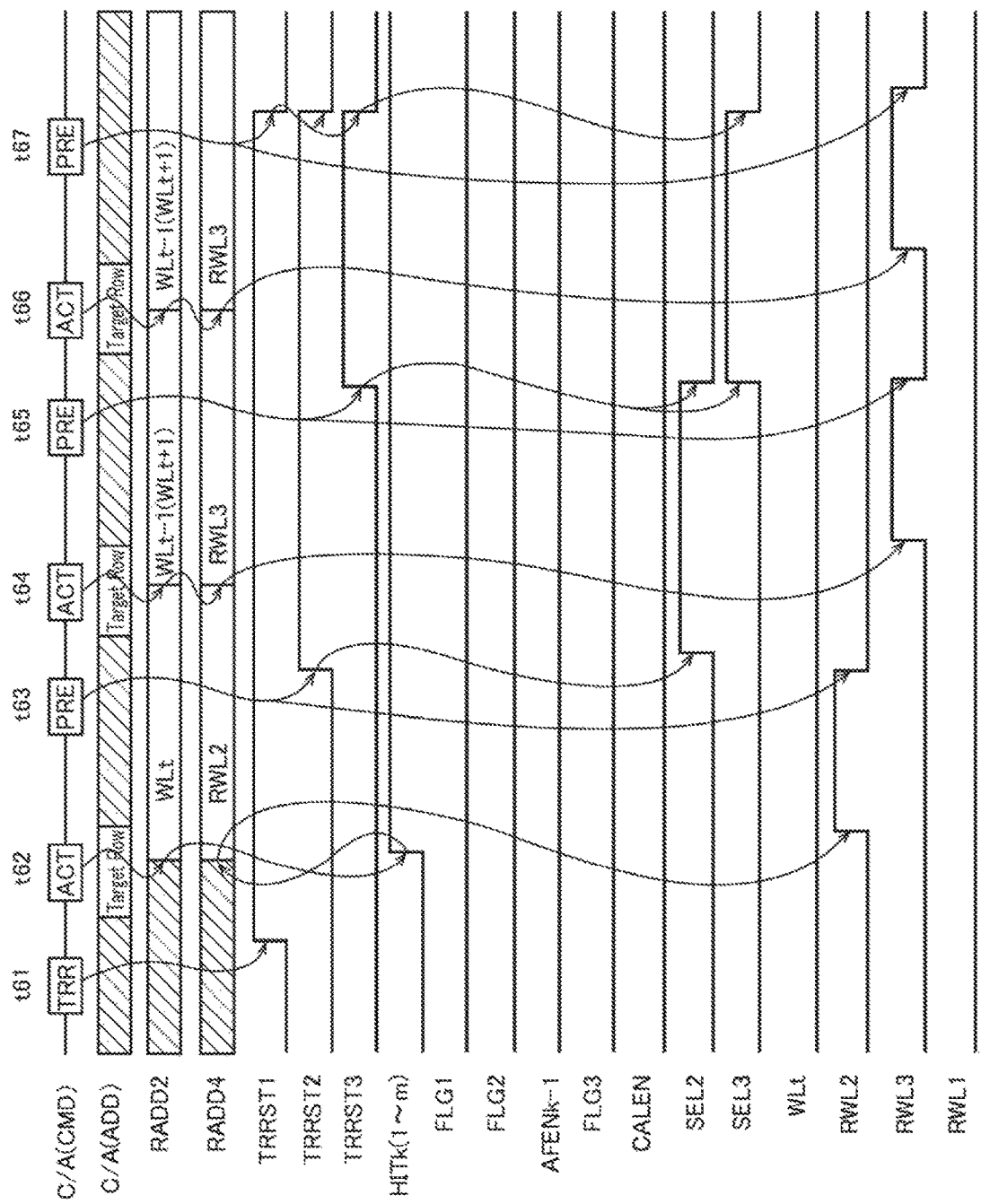
FIG. 22 is a timing chart showing target-row refresh operations in the case 2.

FIG. 22 is a second timing chart for explaining target-row refresh operations in the case 4. Herein, in the case 4, a case in which the redundant word line RWLj−1 or RWLj+1is unused will be explained.

The operations corresponding to time t61 to t65 are similar to those of FIG. 21. More specifically, the redundant word line RWLj is selected in a first target-row refresh operation, and the redundant word line RWLj−1 or RWLj+1 is selected in a second target-row refresh operation. Then, the target address is input in relation to a third target-row refresh operation (time t66). In the present example, the redundant word line RWLj−1 or RWLj+1 is unused; therefore, it is assumed that the enable signal AFENk−1 is at the low level if the least significant bit X0 of the row address is "0", and the enable signed AFENk+1 is at the low level if the least significant bit X0 of the row address is "1". Therefore, the usage detection signal USEk maintains the low level. Therefore, even if the state signal TRRST2 is activated, the flag signal FLG3 is maintained at the low level. Therefore, forcible address conversion by the address conversion circuit 44 is not carried out, and, also in the third target-row refresh operation, the redundant word line RWLj−1 or RWLj+1 is selected again as well as the second one.

If the redundant word line RWLj−1 or RWLj+1 is unused in the case 4 in this manner, the redundant word line RWLj, which is the replacement destination, and the redundant word line RWLj−1 or RWLj+1 adjacent to the one side of the redundant word line RWLj are sequentially selected, while the redundant word line RWLj−1 or RWLj+1 adjacent to the other side is not selected. As a result, unexpected erroneous operations caused by selecting the unused redundant word line RWL are prevented.

As explained above, in the semiconductor device 10 according to the present embodiment, the target-row refresh operations are carried out in consideration of the presence of the redundant word lines. Therefore, even if micro short-circuit is present in the unused redundant word line or the memory cell(s) connected thereto, the redundant word line like this is prevented from being selected. As a result, correct target-row refresh operations can be realized.

Hereinabove, the preferred embodiment of the present invention has been explained. However, the present invention is not limited to the above described embodiment, various modifications can be made within a range not departing from the gist of the present invention, and it goes without saying that they are also included in the range of the present invention.

What is claimed is:

1. A method comprising:
receiving a first command to enter a target-row refresh mode;
receiving a second command and a third command during the target-row refresh mode, wherein the second command is accompanied by first address information designating a first word line of a plurality of word lines in a memory array, wherein the third command is accompanied by the first address information designating the first word line, and wherein the plurality of word lines further includes a second word line that is proximate to the first word line; and
performing, responsive to the second command and the third command, a refresh operation on the memory array by:
responsive to the second command, activating the first word line; and
responsive to the third command, activating the second word line if the second word line is functional and not activating the second word line if the second word line is not functional.

2. The method of claim 1, further comprising:
before entering the target-row refresh mode, storing defective address information,
wherein the performing a refresh operation on the memory array further includes:
responsive, at least in part, to the first address information accompanying the third command, providing second address information designating the second word line; and
comparing the second address information with the defective address information to cause the second word line to be activated when the second address information does not match the defective address information due to the second word line being functional and to be not activated when the second address information matches the defective address information due to the second word line being not functional.

3. The method of claim 2, wherein each of the first word line and the second word line is a normal word line, and wherein the plurality of word lines further includes a redundant word line that is to be used in place of the second word line when the second word line is defective.

4. The method of claim 3, wherein the performing a refresh operation on the memory array further comprises:
activating the redundant word line when the second address information matches the defective address information as the second word line being defective.

5. The method of claim 1, wherein the first word line is a first redundant word line and the second word line is a second redundant word line.

6. The method of claim 5, further comprising:
before entering the target-row refresh mode, storing enable information indicating whether the second redundant word line is used or not used,
wherein the performing a refresh operation on the memory array further comprises investigating the enable information to cause the second redundant word line to be activated when the enable information indicates that the second redundant word line is used due to the second word line being functional and to be not activated when the enable information indicates that the second redundant word line is not used due to the second word line being not functional.

7. The method of claim 1, further comprising:
before entering the target-row refresh mode, storing defective address information,
wherein the second word line is activated when second address information designating the second word line does not match the defective address information.

8. The method of claim 1, further comprising:
before entering the target-row refresh mode, storing defective address information,
wherein the second word line is not activated when second address information designating the second word line does not match the defective address information.

9. The method of claim 1, wherein the second word line is determined to be functional when address information provided to designate the second word line is not defective.

10. The method of claim 1, wherein the second word line is determined to be not functional when address information provided to designate the second word line is defective.

11. The method of claim 1, wherein each of the first word line and the second word line is a normal word line.

12. The method of claim 1, wherein the first word is a normal word line and the second word line is a redundant word line.

13. A method comprising:
receiving a first command to enter a target-row refresh mode;
receiving a second command and a third command during the target-row refresh mode, wherein the second command is accompanied by first address information designating a first word line of a plurality of word lines in a memory array, wherein the plurality of word lines further includes a second word line that is proximate to the first word line, and wherein enable information indicating whether the second word line is used or not used is stored before entering the target-row refresh mode; and
performing a refresh operation on the memory array by activating the first or second word line responsive to the second or third command, respectively.

14. The method of claim 13, wherein the first word line is a normal word line and the second word line is a redundant word line.

15. The method of claim 14, wherein the performing a refresh operation on the memory array further includes investigating the enable information to cause the redundant word line to be activated when the enable information indicates that the redundant word line is used due to the second word line being functional and to be not activated when the enable information indicates that the redundant word line is not used due to the second word line being not functional.

16. The method of claim 14, wherein the performing a refresh operation on the memory array further includes investigating the enable information to cause the redundant word line to be activated when the enable information indicates that the redundant word line is used.

17. The method of claim 14, wherein the performing a refresh operation on the memory array further includes investigating the enable information to cause the redundant word line to be not activated when the enable information indicates that the redundant word line is not used.

18. The method of claim 13, wherein the performing a refresh operation on the memory array includes:
responsive to the second command, activating the first word line; and
responsive to the third command, activating the second word line if the second word line is functional and not activating the second word line if the second word line is not functional, and
wherein the second word line is activated based on the stored enable information.

19. A method comprising:
receiving a first command to enter a target-row refresh mode;
receiving a second command and a third command during the target-row refresh mode, wherein the second command is accompanied by first address information designating a first word line of a plurality of word lines in a memory array, wherein the third command is accompanied by the first address information designating the first word line, and wherein the plurality of word lines further includes a second word line that is proximate to the first word line; and
performing, responsive to the second command and the third command, a refresh operation on the memory array,
wherein enable information used to cause the second word line to be activated is stored before entering the target-row refresh mode.

20. The method of claim 19, wherein the performing a refresh operation on the memory array further includes investigating the enable information to cause the second word line to be activated when the enable information indicates that the second word line is used.

21. The method of claim 19, wherein the performing a refresh operation on the memory array further includes investigating the enable information to cause the second word line to be not activated when the enable information indicates that the second word line is not used due to the second word line being not functional.

22. The method of claim 19, wherein the first word line is a first redundant word line and the second word line is a second redundant word line.

23. The method of claim 22, wherein the performing a refresh operation on the memory array further includes investigating the enable information to cause the second redundant word line to be activated when the enable information indicates that the second redundant word line is used.

24. The method of claim 22, wherein the performing a refresh operation on the memory array further includes investigating the enable information to cause the second redundant word line to be activated when the enable information indicates that the second redundant word line is used and to be not activated when the enable information indicates that the second redundant word line is not used.

25. The method of claim 22, wherein the performing a refresh operation on the memory array further includes investigating the enable information to cause the second redundant word line to be activated when the enable information indicates that the second redundant word line is used due to the second word line being functional and to be not activated when the enable information indicates that the second redundant word line is not used due to the second word line being not functional.

26. The method of claim 19, further comprising:
before entering the target-row refresh mode, storing defective address information; and
activating the second word line when second address information designating the second word line does not match the defective address information as the second word line being defective.

27. A method comprising:
receiving a first command to enter a target-row refresh mode;
receiving a second command and a third command during the target-row refresh mode, wherein the second command is accompanied by first address information designating a first word line of a plurality of word lines in a memory array, wherein the third command is accompanied by the first address information designating the first word line, wherein the plurality of word lines further includes a second word line and a third word line, wherein the second word line is proximate to the first word line, and wherein the third word line is proximate to the first word line so that the first word line is sandwiched between the second word line and the third word line; and
performing, responsive to the second command and the third command, a refresh operation on the memory array by:
responsive to the second command, activating the second word line if the second word line is functional and not activating the second word line if the second word line is not functional; and
responsive to the third command, activating the third word line if the third word line is functional and not activating the third word line if the third word line is not functional.

28. The method of claim 27, further comprising:
receiving a fourth command accompanied by the first address information during the target-row refresh mode before receiving each of the second command and the third command.

29. The method of claim 27, wherein the first word line, the second word line and the third word line are a first normal word line, a second normal word line and a third normal word line, respectively.

30. The method of claim 29, further comprising:
before entering the target-row refresh mode, storing a plurality of defective address information,
wherein the performing a refresh operation on the memory array further comprises:

responsive, at least in part, to the first address information accompanying the second command, providing second address information designating the second normal word line; and responsive, at least in part, to the first address information accompanying the third command, providing third address information designating the third normal word line, and wherein the plurality of word lines further includes a first redundant word line and a second redundant word line, the first redundant word line to be used in place of the second normal word line when the second word line is defective, and the second redundant word line to be used in place of the third normal word line when the third word line is defective.

31. The method of claim 30, wherein the performing a refresh operation on the memory array further comprises:

activating the first redundant word line when the second address information matches any one of the plurality of defective address information due to the second word line being not functional; and activating the second redundant word line when the third address information matches any one of the plurality of defective address information due to the third word line being not functional.

32. The method of claim 31, further comprising:

before entering the target-row refresh mode, storing a plurality of defective address information and further storing enable information, the enable information indicating whether each of the first and second redundant word lines is used or not used.

33. An apparatus comprising:

a memory array comprising a plurality of word lines, the plurality of word lines including first, second and third word lines, the second word line being proximate to the first word line, and the third word line being proximate to the first word line so that the first word line is sandwiched between the second word line and the third word line;

a command/address circuit configured to, during a target-row refresh mode, receive first, second and third commands, each of the first, second and third commands being accompanied by first address information designating the first word line; and a refresh control circuit configured to:

responsive to the first command, activate the first word line, responsive to the second command, activate the second word line if the second word line is functional and not activate the second word line if the second word line is not functional, and responsive to the third command, activate the third word line if the third word line is functional and not activate the third word line if the third word line is not functional.

* * * * *

UNITED STATES PATENT AND TRADEMARK OFFICE
CERTIFICATE OF CORRECTION

PATENT NO. : 10,607,686 B2
APPLICATION NO. : 16/112471
DATED : March 31, 2020
INVENTOR(S) : Hiroshi Akamatsu It is certified that error appears in the above-identified patent and that said Letters Patent is hereby corrected as shown below:

In the Claims

| | Reads | Should Read |
|---|---|---|
| Column 22, Line 49 Claim 12, | "wherein the first word is a normal word line" | -- wherein the first word line is a normal word line -- |

Signed and Sealed this
Twenty-fourth Day of May, 2022

*Katherine Kelly Vidal*

Katherine Kelly Vidal
*Director of the United States Patent and Trademark Office*